(12) United States Patent
Kang et al.

(10) Patent No.: US 9,256,109 B2
(45) Date of Patent: Feb. 9, 2016

(54) ORGANIC LIGHT-EMITTING DISPLAY DEVICE, METHOD OF REPAIRING THE SAME, AND METHOD OF DRIVING THE SAME

(71) Applicant: Samsung Display Co., Ltd., Yongin, Gyeonggi-Do (KR)

(72) Inventors: Ki-Nyeng Kang, Yongin (KR); Na-Young Kim, Yongin (KR); Soo-Beom Jo, Yongin (KR); Jae-Ho Lee, Yongin (KR); Myung-Koo Hur, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 86 days.

(21) Appl. No.: 14/062,816

(22) Filed: Oct. 24, 2013

(65) Prior Publication Data
US 2014/0292827 A1     Oct. 2, 2014

(30) Foreign Application Priority Data
Apr. 1, 2013    (KR) ................... 10-2013-0035459

(51) Int. Cl.
*G02F 1/1362*    (2006.01)
*G09G 3/32*      (2006.01)
(Continued)

(52) U.S. Cl.
CPC ............ *G02F 1/136259* (2013.01); *G09G 3/20* (2013.01); *G09G 3/3233* (2013.01); *G09G 3/3241* (2013.01); *H01L 27/3223* (2013.01); *G09G 2230/00* (2013.01); *G09G 2300/0413* (2013.01); *G09G 2300/0426* (2013.01); *G09G 2300/0819* (2013.01); *G09G 2300/0852* (2013.01); *G09G 2300/0861* (2013.01); *G09G 2330/08* (2013.01); *G09G 2330/10* (2013.01); *H01L 2251/568* (2013.01)

(58) Field of Classification Search
CPC .............. G02F 1/136259; G02F 2001/133388; G02F 2001/136232; H01L 27/3223; H01L 2251/568; G09G 2300/0413
See application file for complete search history.

(56) References Cited

U.S. PATENT DOCUMENTS 5,298,891 A  *  3/1994  Plus et al. ...................... 345/93
2005/0168491 A1 * 8/2005  Takahara et al. ............. 345/690
(Continued)

FOREIGN PATENT DOCUMENTS

EP      2 256 544 A1    12/2010
JP      2007-316511   * 12/2007 ............... G09G 3/30
(Continued)

OTHER PUBLICATIONS

EPO Search Report dated Jul. 21, 2014, for corresponding European Patent application 14162663.0, (10 pages).

*Primary Examiner* — Sanjiv D Patel
(74) *Attorney, Agent, or Firm* — Christie, Parker & Hale, LLP

(57) ABSTRACT

An organic light-emitting display device includes a plurality of emission pixels aligned in columns and rows, each of the emission pixels including an emission device and a first pixel circuit coupled to the emission device, a dummy pixel including a second pixel circuit in each column of the emission pixels, and a repair line in each column, wherein a same data signal is provided to one of the emission pixels coupled to the repair line and to the dummy pixel coupled to the repair line, and wherein the emission pixels are configured to simultaneously emit light.

19 Claims, 19 Drawing Sheets

(51) Int. Cl.
*G09G 3/20* (2006.01)
*H01L 27/32* (2006.01)

(56) References Cited

U.S. PATENT DOCUMENTS

| | | | |
|---|---|---|---|
| 2006/0012728 A1* | 1/2006 | Watamura | 349/43 |
| 2009/0207333 A1* | 8/2009 | No et al. | 349/54 |
| 2009/0218569 A1 | 9/2009 | Fujikawa | |
| 2009/0231255 A1* | 9/2009 | Tanimoto et al. | 345/87 |
| 2009/0262054 A1* | 10/2009 | Hsu et al. | 345/87 |
| 2010/0320472 A1 | 12/2010 | Liu | |
| 2011/0032442 A1* | 2/2011 | van Aerle et al. | 349/38 |
| 2012/0092579 A1* | 4/2012 | Liu | 349/55 |
| 2012/0098826 A1 | 4/2012 | Lee et al. | |
| 2012/0162275 A1* | 6/2012 | Park | 345/690 |
| 2012/0300165 A1* | 11/2012 | Zhuang et al. | 349/139 |
| 2013/0120230 A1* | 5/2013 | Chen et al. | 345/92 |

FOREIGN PATENT DOCUMENTS

| | | |
|---|---|---|
| KR | 10-2008-0024009 | 3/2008 |
| KR | 10-2008-0059928 | 7/2008 |

* cited by examiner

ORGANIC LIGHT-EMITTING DISPLAY DEVICE, METHOD OF REPAIRING THE SAME, AND METHOD OF DRIVING THE SAME

CROSS-REFERENCE TO RELATED PATENT APPLICATIONS

This application claims priority to and the benefit of Korean Patent Application No. 10-2013-0035459, filed on Apr. 1, 2013 in the Korean Intellectual Property Office, the disclosure of which is incorporated herein in its entirety by reference.

BACKGROUND

1. Field

Embodiments of the present invention relate to an organic light-emitting display device, a method of repairing the same, and a method of driving the same.

2. Description of the Related Art

If a certain pixel is defective, the pixel may constantly emit light regardless of the presence of a scan signal and a data signal. The pixel that emits light all the time is regarded as a bright spot (or a hot spot), and has high visibility, and is thus easily recognized by a user. Accordingly, a defective pixel having a high visibility and viewed as a bright spot was conventionally converted to a dark spot to allow the defective pixel to be less likely to be recognized. However, as complexity of pixel circuitry becomes relatively complicated, a bright spot due to a circuit defect may not be easily solved.

SUMMARY

Embodiments of the present invention provide a display device for forming a redundancy pattern in each column of pixels on a panel and for normally driving a defective pixel by using the redundancy pattern.

According to an aspect of embodiments of the present invention, there is provided an organic light-emitting display device including a plurality of emission pixels aligned in columns and rows, each of the emission pixels including an emission device and a first pixel circuit coupled to the emission device, a dummy pixel including a second pixel circuit in each column of the emission pixels, and a repair line in each column, wherein a same data signal is provided to one of the emission pixels coupled to the repair line and to the dummy pixel coupled to the repair line, and wherein the emission pixels are configured to simultaneously emit light.

The dummy pixel may be at a first row or a last row.

The emission pixels may be at a display area, and the dummy pixel may be at a non-display area.

The first and second pixel circuits may have the same configuration.

The first pixel circuit of the emission pixel coupled to the repair line may be decoupled from the emission device.

The emission device may include an anode, a cathode, and an emission layer between the anode and the cathode, and a wiring of the first pixel circuit of the emission pixel coupled to the repair line may be decoupled from the anode of the emission device.

The emission pixel coupled to the repair line may include a first conductive unit contacting an anode of the emission device, and first contact metal for coupling the first conductive unit to the repair line, and the dummy pixel coupled to the repair line may include a second conductive unit extending from the second pixel circuit, and second contact metal for coupling the second conductive unit to the repair line.

The first conductive unit and the repair line may be at a same layer.

The repair line may be at a same layer and may include a same material as source and drain electrodes of thin film transistors of the first and second pixel circuits.

The repair line may be at a same layer and may include a same material as the anode.

The organic light-emitting display device may further include at least one insulating layer between the repair line and a first conductive unit contacting an anode of the emission device of the emission pixel coupled to the repair line, and between the repair line and a second conductive unit coupled to the second pixel circuit of the dummy pixel coupled to the repair line, and the first and second conductive units may be laser welded to the repair line.

The first and second conductive units may be at a same layer and may include a same material as gate electrodes of thin film transistors of the first and second pixel circuits, and the repair line may be at a same layer and may include a same material as source and drain electrodes of the thin film transistor.

According to another aspect of embodiments of the present invention, there is provided a method of driving an organic light-emitting display device including a plurality of emission pixels columns and rows, the emission pixels each including an emission device and a first pixel circuit coupled to the emission device, the organic light-emitting display device also including a dummy pixel including a second pixel circuit in each column, and a repair line in each column, the method including sequentially providing data signals to the emission pixels and to the dummy pixel, wherein a same data signal is provided to one of the emission pixels coupled to the repair line and to the dummy pixel coupled to the repair line, and simultaneously emitting light from emission devices of the emission pixels according to driving currents corresponding to the data signals.

The dummy pixel may be at a top or at a bottom of its corresponding column.

The sequentially providing data signals may be before the simultaneously emitting light from emission devices, in a frame.

The sequentially providing data signals and the simultaneously emitting light from emission devices may partially and temporally overlap.

According to another aspect of embodiments of the present invention, there is provided a method of repairing an organic light-emitting display device including a plurality of emission pixels in columns and rows, each of the emission pixels including an emission device and a first pixel circuit coupled to the emission device, the organic light-emitting display device further including a dummy pixel including a second pixel circuit in each column, and a repair line in each column, wherein the emission pixels are configured to simultaneously emit light, the method including decoupling the emission device of a first defective pixel of the emission pixels from the first pixel circuit of the first defective pixel, coupling the emission device of the first defective pixel to the repair line in a same column as the first defective pixel, and coupling the repair line to the second pixel circuit of a first dummy pixel in the same column as the first defective pixel for enabling the first dummy pixel to receive a data signal that matches the data signal provided to the first defective pixel, for providing a driving current corresponding to the received data signal via the repair line to the emission device of the first defective pixel, and for allowing the first defective pixel to emit light simultaneously with the emission pixels.

The coupling the emission device of the first defective pixel to the repair line may include forming first contact metal on a first conductive unit coupled to an anode of the emission device of the first defective pixel, and the coupling of the repair line to the second pixel circuit of the first dummy pixel may include forming second contact metal on a second conductive unit coupled to the second pixel circuit of the first dummy pixel.

The coupling the emission device of the first defective pixel to the repair line may include using laser welding to electrically couple a first conductive unit, which is coupled to an anode of the emission device of the first defective pixel, to the repair line, which is insulated from the first conductive unit by at least one insulating layer, and the coupling the repair line to the second pixel circuit of the first dummy pixel may include using laser welding to electrically couple a second conductive unit, which is coupled to the second pixel circuit of the first dummy pixel, to the repair line, which insulated from the second conductive unit by at least one insulating layer.

The method may further include decoupling the emission device of a second defective pixel, which is in the same column as the first defective pixel, from the first pixel circuit, cutting the repair line between the first and second defective pixels, and coupling the second pixel circuit of a second dummy pixel, which is in the same column as the first defective pixel, to a portion of the repair line from which the first defective pixel is electrically isolated due to the cutting of the repair line, so as to be configured to receive a data signal that matches the data signal provided to the second defective pixel, to provide a driving current corresponding to the received data signal via the repair line to the emission device of the second defective pixel, and to allow the second defective pixel to emit light simultaneously with the plurality of emission pixels.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Figure 1:
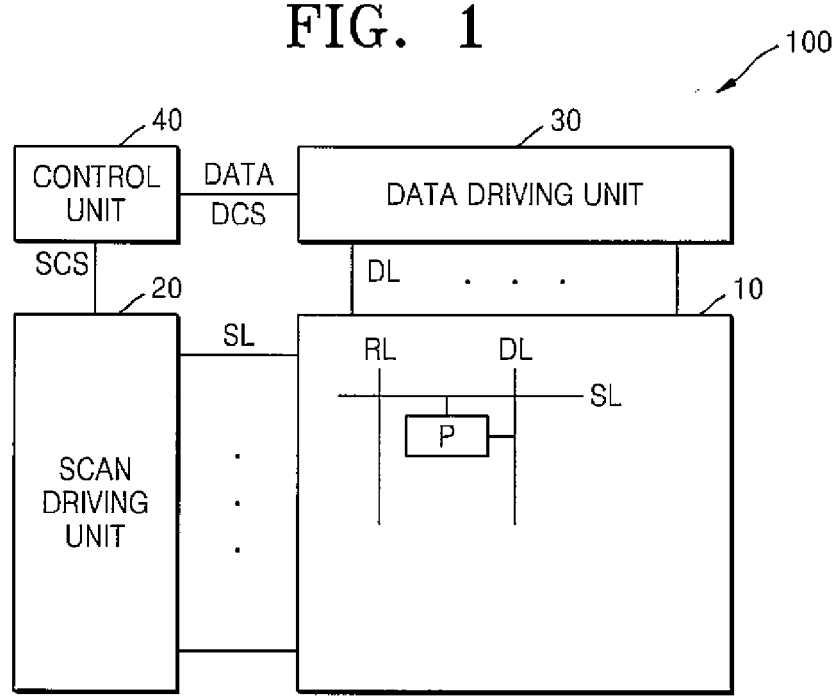
FIG. 1 is a block diagram of a display device according to an embodiment of the present invention.

Hereinafter, embodiments of the present invention will be described in detail by explaining exemplary embodiments of the invention with reference to the attached drawings. Like reference numerals in the drawings denote like elements. In the following description of embodiments of the present invention, a detailed description of known functions and configurations incorporated herein will be omitted when it may make the subject matter of the present invention less clear.

In the drawings, the thicknesses of layers and regions may be exaggerated for clarity. It will be understood that when a layer is referred to as being "on" another layer or substrate, it can be directly on the other layer or substrate, or one or more intervening layers may also be present.

It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. Also, the term "on" refers to an upper or a lower side of a target, and does not always mean an upper side with respect to a direction of gravity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

As used herein, the term "and/or" includes any and all combinations of one or more of the associated listed items. Expressions such as "at least one of," when preceding a list of elements, modify the entire list of elements, and do not modify the individual elements of the list.

FIG. 1 is a block diagram of a display device 100 according to an embodiment of the present invention.

Referring to FIG. 1, the display device 100 includes a display panel 10 including a plurality of pixels, a scan driving unit 20, a data driving unit 30, and a control unit 40. The scan driving unit 20, the data driving unit 30, and the control unit 40 may be separately located on different semiconductor chips, or may be integrated on one semiconductor chip. Also, the scan driving unit 20 may be formed on the same substrate as the display panel 10.

A plurality of scan lines SL extending in a horizontal direction, and a plurality of the data lines DL extending in a vertical direction and perpendicularly crossing the scan lines SL, are formed at the display panel 10. Also, a plurality of repair lines RL extending to be substantially parallel with, and spaced apart from, the data lines DL, and to be perpendicularly crossing the scan lines SL, are formed at the display panel 10. A plurality of pixels P aligned in a substantial matrix shape/configuration are formed where the scan lines SL, the data lines DL, and the repair lines RL cross each other.

Although the data line DL is formed at a right side of the pixel P and the repair line RL is formed at a left side of the pixel P in FIG. 1, the present invention is not limited thereto and the positions of the data line DL and the repair line RL may be switched. Also, according to the design of the pixels P, the repair lines RL may be formed to be parallel with the scan lines SL and one or more repair lines RL may be formed in each pixel column. Although not shown in FIG. 1, a plurality of emission control lines for providing an emission control signal, an initialization voltage line for providing an initialization voltage, a driving voltage line for providing a power voltage, etc. may be additionally formed at the display panel 10.

The scan driving unit 20 may generate and sequentially provide scan signals via the scan lines SL to the display panel 10.

The data driving unit 30 may sequentially provide data signals via the data lines DL to the display panel 10. The data driving unit 30 transforms input image data DATA input from the control unit 40 and having a grayscale, into a voltage or current data signal.

The control unit 40 generates and transmits a scan control signal SCS and a data control signal DCS respectively to the scan driving unit 20 and the data driving unit 30. As such, the scan driving unit 20 sequentially provides scan signals to the scan lines SL, and the data driving unit 30 provides data signals to the pixels P. Also, a first power voltage ELVDD, a second power voltage ELVSS, an emission control signal EM, an initialization voltage Vint, etc. may be provided to the pixels P under the control of the control unit 40. Furthermore, the control unit 40 controls the scan driving unit 20 to provide a scan signal to a dummy pixel and controls the data driving unit 30 to provide a data signal the same as the data signal provided or to be provided to a defective signal, to the dummy pixel when the scan signal is provided to the dummy pixel.

Figure 2:
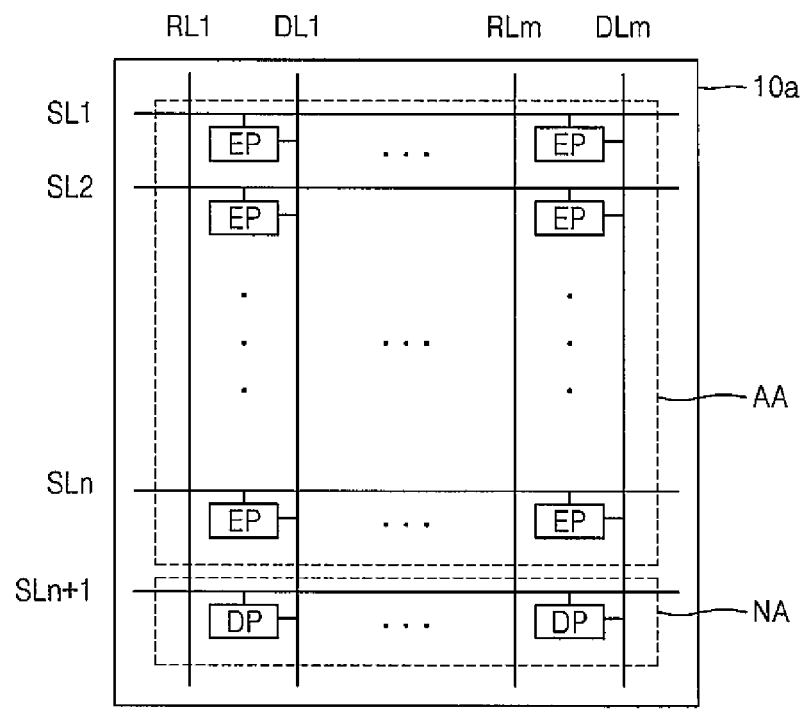
FIGS. 2 through 4 are schematic diagrams of examples of a display panel illustrated in FIG. 1.
Figure 3:
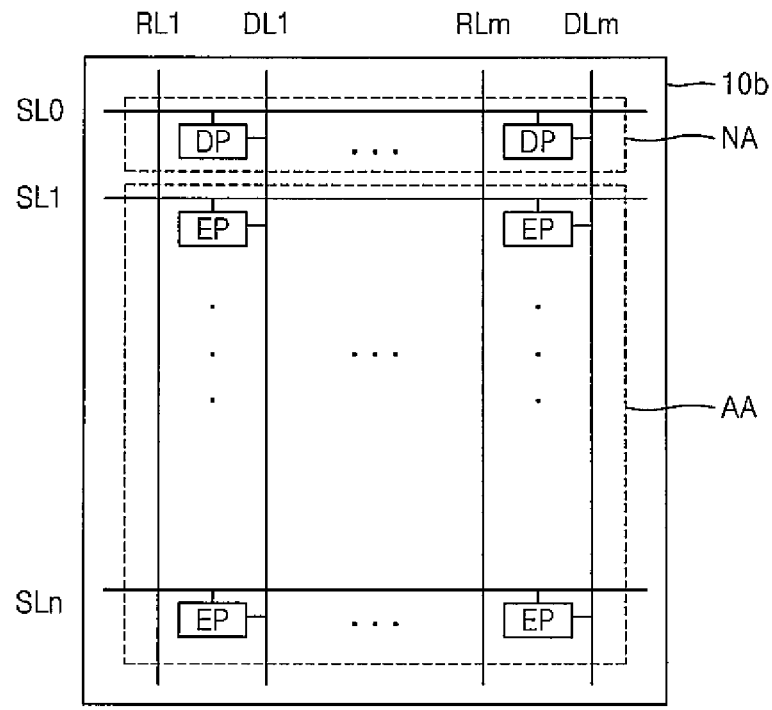
Figure 4:
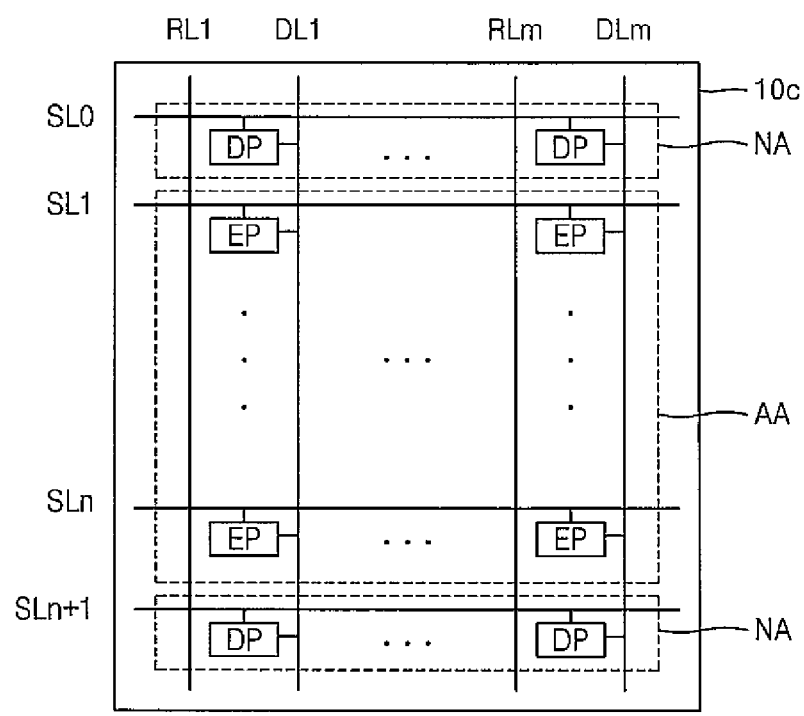

FIGS. 2 through 4 are schematic diagrams of examples of the display panel 10 illustrated in FIG. 1.

Referring to FIGS. 2 through 4, a plurality of pixels P aligned in a substantial matrix shape are formed where a plurality of scan lines SL cross a plurality of data lines DL and a plurality of repair lines RL on a display panel 10a, 10b, or 10c. The pixels P include emission pixels EP formed at a display area AA and dummy pixels DP formed at a non-display area NA. The non-display area NA may be formed at regions either above, below, or both above and below, the display area AA. As such, one or more dummy pixels DP may be formed in each pixel column on at least one of top and bottom regions of the pixel column.

Referring to FIG. 2, the display panel 10a includes a display area AA and a non-display area NA formed under the display area AA. First through nth scan lines SL1 through SLn are formed at the display area AA, and an (n+1)th scan line SLn+1 is formed at the non-display area NA. First through mth data lines DL1 through DLm and first through mth repair lines RL1 through RLm are formed separately in pixel columns at the display area AA and the non-display area NA. A plurality of emission pixels EP coupled to the first through nth scan lines SL1 through SLn and the first through mth data lines DL1 through DLm are formed at the display area AA. A plurality of dummy pixels DP coupled to the (n+1)th scan line SLn+1 and the first through mth data lines DL1 through DLm are formed at the non-display area NA.

Referring to FIG. 3, the display panel 10b includes a display area AA and a non-display area NA at the display area AA. From among zeroth through nth scan lines SL0 through SLn, the first through nth scan lines SL1 through SLn are formed at the display area AA, and the zeroth scan line SL0 is formed at the non-display area NA. First through mth data lines DL1 through DLm and first through mth repair lines RL1 through RLm are formed separately in pixel columns at both of the display area AA and the non-display area NA. A plurality of emission pixels EP coupled to the first through nth scan lines SL1 through SLn and to the first through mth data lines DL1 through DLm are formed at the display area AA, and a plurality of dummy pixels DP coupled to the zeroth scan line SL0 and to the first through mth data lines DL1 through DLm are formed at the non-display area NA.

Referring to FIG. 4, the display panel 10c includes a display area AA and a non-display area NA formed both above and below the display area AA. First through nth scan lines SL1 through SLn are formed at the display area AA, and the zeroth and (n+1)th scan lines SL0 and SLn+1 are formed at the non-display area NA. First through mth data lines DL1 through DLm and first through mth repair lines RL1 through RLm are formed separately in pixel columns at both of the display area AA and the non-display area NA. A plurality of emission pixels EP coupled to the first through nth scan lines SL1 through SLn and to the first through mth data lines DL1 through DLm are formed at the display area AA. A plurality of dummy pixels DP coupled to the zeroth and (n+1)th scan lines SL0 and SLn+1 and to the first through mth data lines DL1 through DLm are formed at the non-display area NA.

Figure 5:
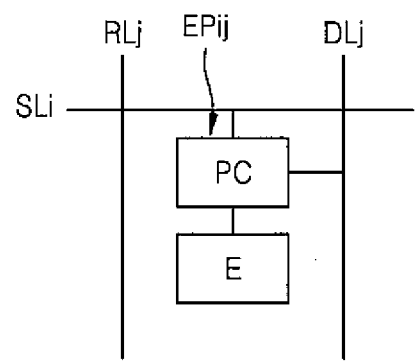
FIG. 5 is a schematic diagram of an emission pixel according to an embodiment of the present invention.

FIG. 5 is a schematic diagram of an emission pixel according to an embodiment of the present invention. Referring to FIG. 5, an emission pixel EPij coupled to an ith scan line SLi (where i=1, . . . , n, and n is a natural number) and a jth data line DLj (where j=1, . . . , m, and m is a natural number) includes a pixel circuit PC and an emission device E for emitting light using a driving current received from the pixel circuit PC. The pixel circuit PC may include at least one thin film transistor (TFT) and at least one capacitor. The emission device E may be an organic light-emitting diode (OLED) including an anode, a cathode, and an emission layer therebetween.

Figure 6:
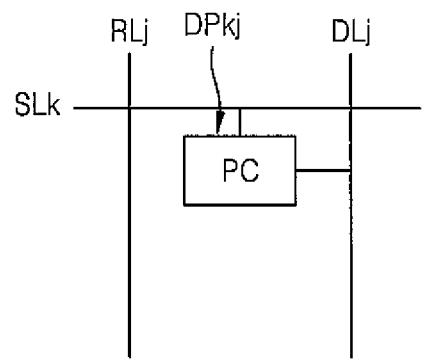
FIG. 6 is a schematic diagram of a dummy pixel according to an embodiment of the present invention.

FIG. 6 is a schematic diagram of a dummy pixel according to an embodiment of the present invention. Referring to FIG. 6, a dummy pixel DPkj coupled to a kth scan line SLk (where k=0 or n+1, and n is a natural number) and a jth data line DLj (where j=1, . . . , m, and m is a natural number) includes only a pixel circuit PC, and does not include an emission device E. The pixel circuit PC of the dummy pixel DPkj is the same as the pixel circuit PC of the emission pixel EPij.

Figure 7:
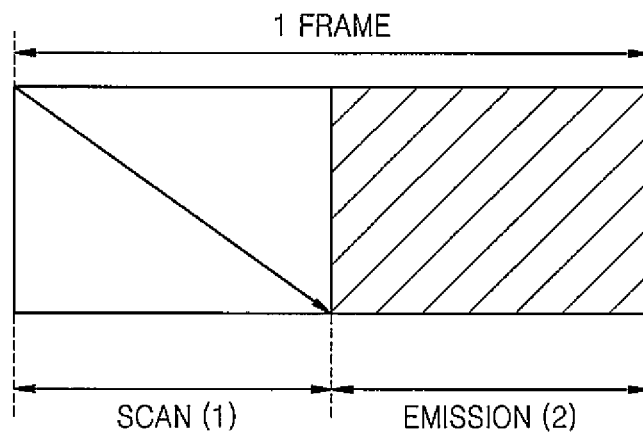
FIGS. 7 and 8 are diagrams for describing a method of driving a display device, according to embodiments of the present invention.
Figure 8:
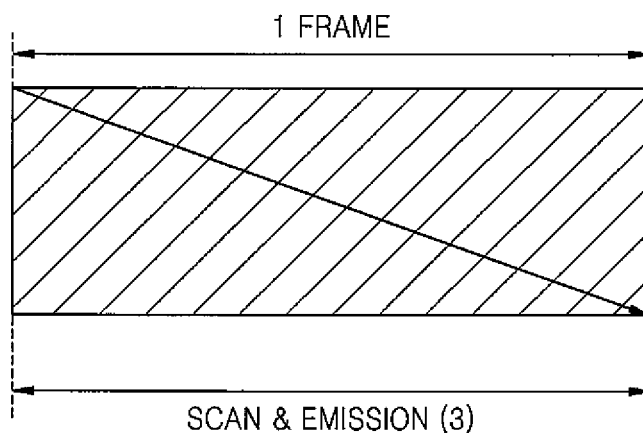

FIGS. 7 and 8 are diagrams for describing a method of driving a display device 100, according to embodiments of the present invention. Referring to FIG. 7, the display device 100 is driven with a scan period 1 (e.g., SCAN (1)) and an emission period 2 (e.g., EMISSION (2)) during one frame. In the scan period 1, scan signals are sequentially provided to a plurality of scan lines, and a voltage corresponding to a data signal is charged in a capacitor of each emission pixel EP. In the emission period 2, OLEDs of all emission pixels EP receive a current corresponding to the charged voltage, and emit light (e.g., simultaneously emit light) of a respective brightness corresponding to the received current.

If one of the emission pixels EP is defective, and thus a dummy pixel DP in the same column is used, in the scan period 1, scan signals are sequentially provided to scan lines including a scan line coupled to the dummy pixel DP. In this case, a data signal the same as the data signal provided to the defective pixel is provided to the dummy pixel DP. In the emission period 2, the OLEDs of all emission pixels EP (including the defective pixel) receive a current corresponding to the charged voltage, and emit light (e.g., simultaneously emit light) to a respective brightness corresponding to the received current. Here, the OLED of the defective pixel receives a current from the dummy pixel DP, and emits light to a brightness corresponding to the received current.

The scan period 1 is performed prior to the emission period 2. A voltage corresponding to a data signal of an Nth frame is charged in each emission pixel EP and in the dummy pixel DP in the scan period 1, and the OLEDs of all of the emission pixels EP may emit light according to a current corresponding to the data signal of the Nth frame in the emission period 2.

Referring to FIG. 8, the display device 100 is driven with a scan and emission period 3 (e.g., SCAN & EMISSION (3)) during one frame. In the scan and emission period 3, scan signals are sequentially provided to the scan lines, and a voltage corresponding to a data signal of an Nth frame is charged in a capacitor of each emission pixel EP. At the same time, in the scan and emission period 3, OLEDs of all emission pixels EP receive a current corresponding to a voltage charged corresponding to a data signal of an (N−1)th frame, and emit light (e.g., simultaneously emit light) to a respective brightness corresponding to the received current. In the scan and emission period 3, an emission period may be the same as a scan period, or may start simultaneously (e.g., substantially simultaneously) with the scan period while ending prior to the scan period.

If there is a defective emission pixel EP, and thus a dummy pixel DP in the same column is used, in the scan and emission period 3, scan signals and data signals of an Nth frame are sequentially provided to scan lines including a scan line coupled to the dummy pixel DP. In this case, a data signal, which is the same as the data signal provided to the defective pixel, is provided to the dummy pixel DP. At the same time, in the scan and emission period 3, the OLEDs of all emission pixels EP (including the defective pixel) receives a current corresponding to a voltage charged corresponding to a data signal of an (N−1)th frame, and emit light (e.g., simultaneously emit light) of a respective brightness corresponding to the received current. Here, the OLED of the defective pixel receives a current from the dummy pixel DP, and emits light of a brightness corresponding to the received current.

Although only a scan period and an emission period are performed in one frame in FIGS. 7 and 8, other periods (e.g., an initialization period, a compensation period for compensating a threshold voltage, an emission off period, etc.) may be additionally performed in the one frame.

Figure 9:
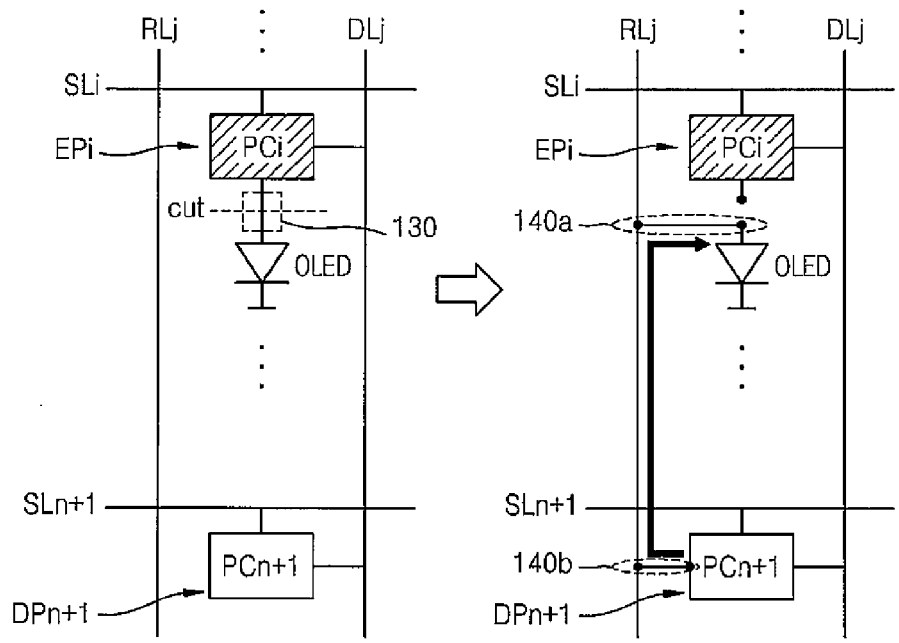
FIG. 9 is a diagram for describing a method of repairing a defective pixel, according to an embodiment of the present invention.

FIG. 9 is a diagram for describing a method of repairing a defective pixel, according to an embodiment of the present invention. Like the display panel 10a illustrated in FIG. 2, FIG. 9 shows a case that a dummy pixel DPn+1 is coupled to an (n+1)th scan line SLn+1 from among first through (n+1)th scan lines SL1 through SLn+1. In FIG. 9, only a jth column is illustrated for the sake of convenience, and an OLED is illustrated as an emission device E.

Referring to FIG. 9, if a pixel circuit PCi of an emission pixel EPi coupled to an ith scan line is defective, an OLED coupled to the pixel circuit PCi is decoupled from the pixel circuit PCI. For this, a cutting unit 130 for electrically coupling the pixel circuit PCi to the OLED is cut by irradiating a laser beam onto the cutting unit 130, thereby electrically separating the pixel circuit PCi from the OLED. For example, a connection region of an anode of the OLED and the pixel circuit PCi of the defective emission pixel EPi may be cut to electrically isolate the pixel circuit PCi from the OLED.

Then, a first repairing unit 140a couples the OLED of the defective emission pixel EPi to a repair line RLj, and a second repairing unit 140b couples a pixel circuit PCn+1 of the dummy pixel DPn+1 to the repair line RLj. For example, an anode of the OLED of the defective emission pixel EPi may be coupled to the repair line RLj, and one electrode of a TFT in the pixel circuit PCn+1 of the dummy pixel DPn+1 may be coupled to the repair line RLj. As such, the OLED of the defective emission pixel EPi is decoupled from the pixel circuit PCi of the defective emission pixel EPi, and is electrically coupled via the repair line RLj to the pixel circuit PCn+1 of the dummy pixel DPn+1.

Figure 10:
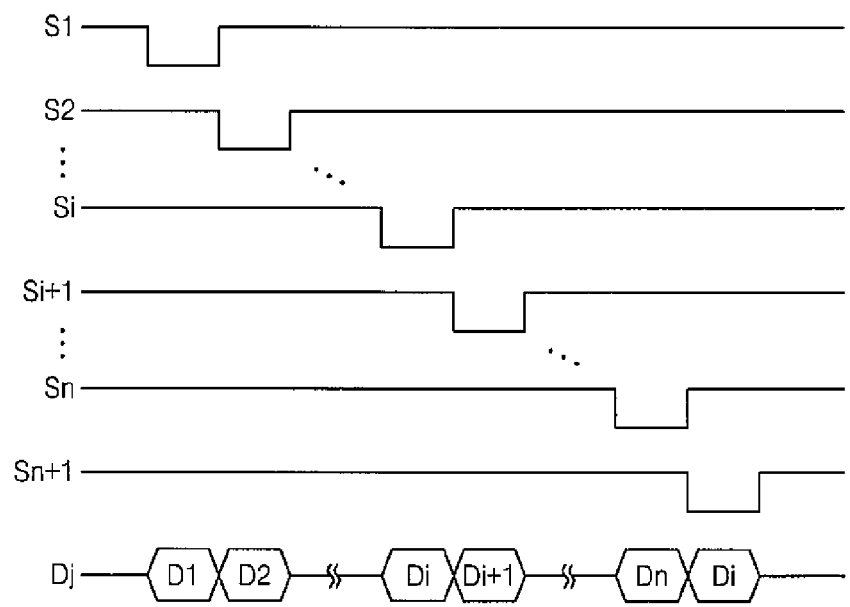
FIG. 10 shows waveforms of scan signals provided by a scan driving unit and data signals provided by a data driving unit of a display panel having a pixel repaired using the method of the embodiment illustrated in FIG. 9.

FIG. 10 shows waveforms of scan signals provided by a scan driving unit, and of data signals provided by a data driving unit, of a display panel having a pixel repaired using the method illustrated in FIG. 9.

Referring to FIG. 10, in a scan period, first through (n+1)th scan signals S1 through Sn+1 are sequentially provided to respective ones of first through (n+1)th scan lines SL1 through SLn+1. First through nth data signals D1 through Dn are sequentially provided to a jth data line DLj in synchronization with the first through (n+1)th scan signals S1 through Sn+1. In this case, a data signal Di, which is the same as the data signal Di provided to a defective emission pixel EPi, is provided again to a dummy pixel DPn+1. Accordingly, an OLED of the defective emission pixel EPi may receive a current corresponding to the data signal Di via a pixel circuit PCn+1 of the dummy pixel DPn+1 and via a repair line RLj. As such, in an emission period, all emission pixels including the defective emission pixel EPi may emit light (e.g., may emit light simultaneously), and thus generation of a bright spot or a dark spot may be suppressed.

Figure 11:
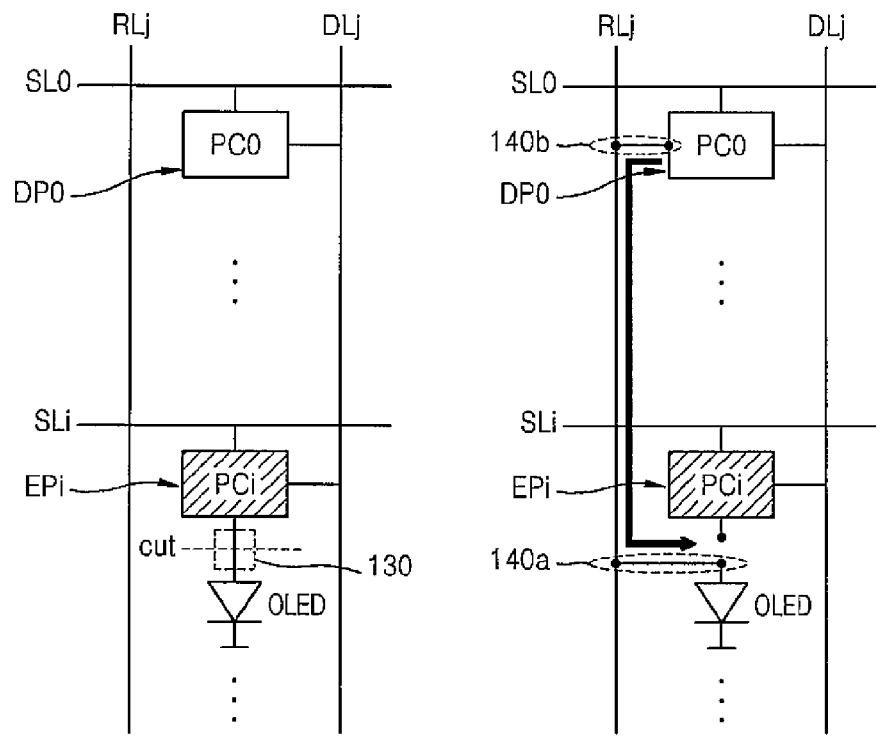
FIG. 11 is a diagram for describing a method of repairing a defective pixel, according to another embodiment of the present invention.

FIG. 11 is a diagram for describing a method of repairing a defective pixel, according to another embodiment of the present invention. Like the display panel 10b illustrated in FIG. 3, FIG. 11 shows a dummy pixel DP0 is coupled to a zeroth scan line SL0, which is among zeroth through nth scan lines SL0 through SLn. In FIG. 11, only a jth column is illustrated for the sake of convenience, and an OLED is illustrated as an emission device E.

Referring to FIG. 11, if a pixel circuit PCi of an emission pixel EPi coupled to an ith scan line is defective, an OLED, which would otherwise be coupled to the pixel circuit PCi, is decoupled from the pixel circuit PCi. For this, a cutting unit 130 for coupling the pixel circuit PCi to the OLED is cut by irradiating a laser beam onto the cutting unit 130, thereby electrically separating the pixel circuit PCi from the OLED. For example, a connection region of an anode of the OLED may be cut to be electrically isolated from the pixel circuit PCi of the defective emission pixel EPi.

Then, a first repairing unit 140a couples the OLED of the defective emission pixel EPi to a repair line RLj, and a second repairing unit 140b couples a pixel circuit PC0 of a dummy pixel DP0 to the repair line RLj. For example, an anode of the OLED of the defective emission pixel ER may be coupled to the repair line RLj, and one electrode of a TFT in the pixel circuit PC0 of the dummy pixel DP0 may also be coupled to the repair line RLj. As such, the OLED of the defective emission pixel ER is decoupled from the pixel circuit PCi of the defective emission pixel EPi, and is electrically coupled via the repair line RLj to the pixel circuit PC0 of the dummy pixel DP0.

Figure 12:
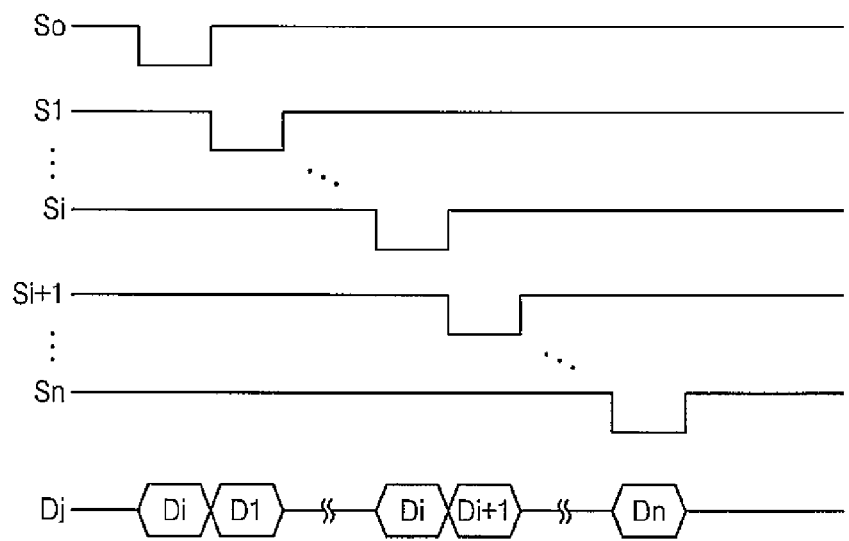
FIG. 12 shows waveforms of scan signals provided by a scan driving unit and data signals provided by a data driving unit of a display panel having a pixel repaired by using the method of the embodiment illustrated in FIG. 11.

FIG. 12 shows waveforms of scan signals provided by a scan driving unit, and data signals provided by a data driving unit, of a display panel having a pixel repaired using the method illustrated in FIG. 11. Referring to FIG. 12, in a scan period, zeroth through nth scan signals S0 through Sn are sequentially and respectively provided to zeroth through nth scan lines SL0 through SLn. First through nth data signals D1 through Dn are sequentially provided to a jth data line DLj in synchronization with the zeroth through nth scan signals S0 through Sn. In this case, a data signal Di, which is the same as the data signal Di to be provided to a defective emission pixel EPi, is initially provided to a dummy pixel DP0 (e.g., the data signal Di is provided to the dummy pixel DP0 prior to being provided to the defective emission pixel EPi). Accordingly, an OLED of the defective emission pixel EPi may receive a current corresponding to the data signal Di via a pixel circuit PC0 of the dummy pixel DP0 and a repair line RLj. As such, in an emission period, all emission pixels including the defective emission pixel EPi may emit light (e.g., simultaneously emit light), and thus generation of a bright spot or a dark spot may be suppressed.

Figure 13:
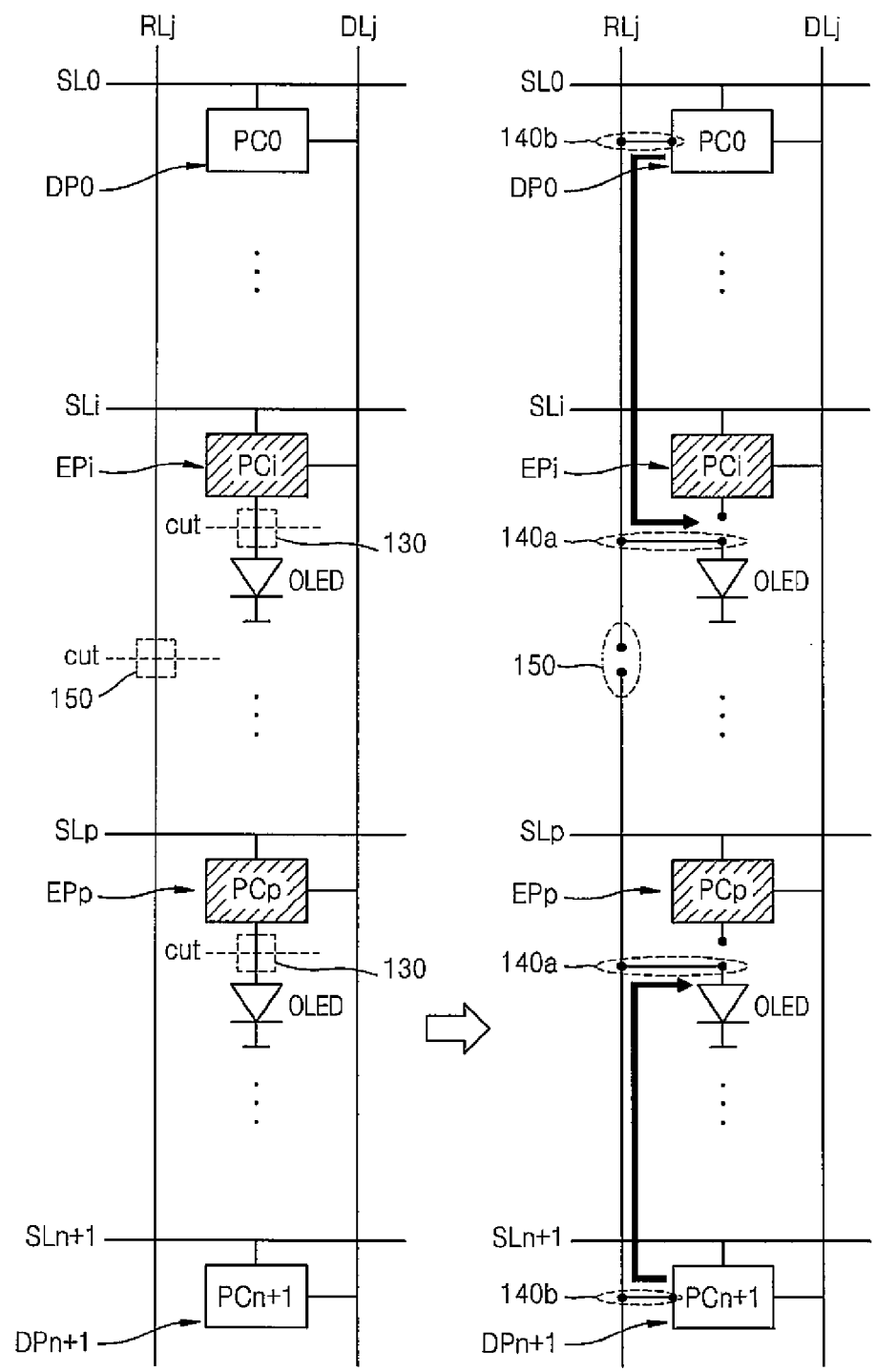
FIG. 13 is a diagram for describing a method of repairing a defective pixel, according to another embodiment of the present invention.

FIG. 13 is a diagram for describing a method of repairing a defective pixel, according to another embodiment of the present invention. Like the display panel 10c illustrated in FIG. 4, FIG. 13 shows dummy pixels DP0 and DPn+1 are coupled to zeroth and (n+1)th scan lines SL0 and SLn+1 from among zeroth through (n+1)th scan lines SL0 through SLn+1. In FIG. 13, only a jth column is illustrated for the sake of convenience, and an OLED is illustrated as an emission device E.

Referring to FIG. 13, if a pixel circuit PCi of an emission pixel EPi coupled to an ith scan line and a pixel circuit PCp of an emission pixel EPp coupled to a pth scan line are defective, OLEDs otherwise respectively coupled to the pixel circuits PCi and PCp are decoupled from the pixel circuits PCi and PCp. For this, cutting units 130 for coupling the pixel circuits PCi and PCp to the respective OLEDs are cut by irradiating laser beams onto the cutting units 130, thereby electrically separating the pixel circuits PCi and PCp from the OLEDs. For example, connection regions of anodes of the OLEDs and the pixel circuits PCi and PCp of the defective emission pixels EPi and EPp may be cut to electrically isolate the OLEDs from the pixel circuits PCi and PCp.

Additionally, a separation unit 150 of the repair line RLj is cut by irradiating a laser beam onto the separation unit 150, thereby separating the repair line RLj into an upper portion and a lower portion. As such, pixel circuits PC0 and PCn+1 of the two dummy pixels DP0 and DPn+1 are electrically separated from each other.

Then, first repairing units 140a connect the OLEDs of the defective emission pixels EPi and EPp to the upper and lower portions of the repair line RLj, and second repairing units 140b connect the pixel circuits PC0 and PCn+1 of the dummy pixel DP0 and DPn+1 to the repair line RLj. For example, anodes of the OLEDs of the defective emission pixels EPi and EPp may be coupled to the repair line RLj, and an electrode of respective TFTs in the pixel circuits PC0 and PCn+1 of the dummy pixels DP0 and DPn+1 may be coupled to the repair line R14. As such, the OLEDs of the defective emission pixels EPi and EPp are decoupled from the pixel circuits PCi and PCp of the defective emission pixels EPi and EPp, and are electrically coupled via the repair line RLj to the pixel circuits PC0 and PCn+1 of the dummy pixels DP0 and DPn+1.

Figure 14:
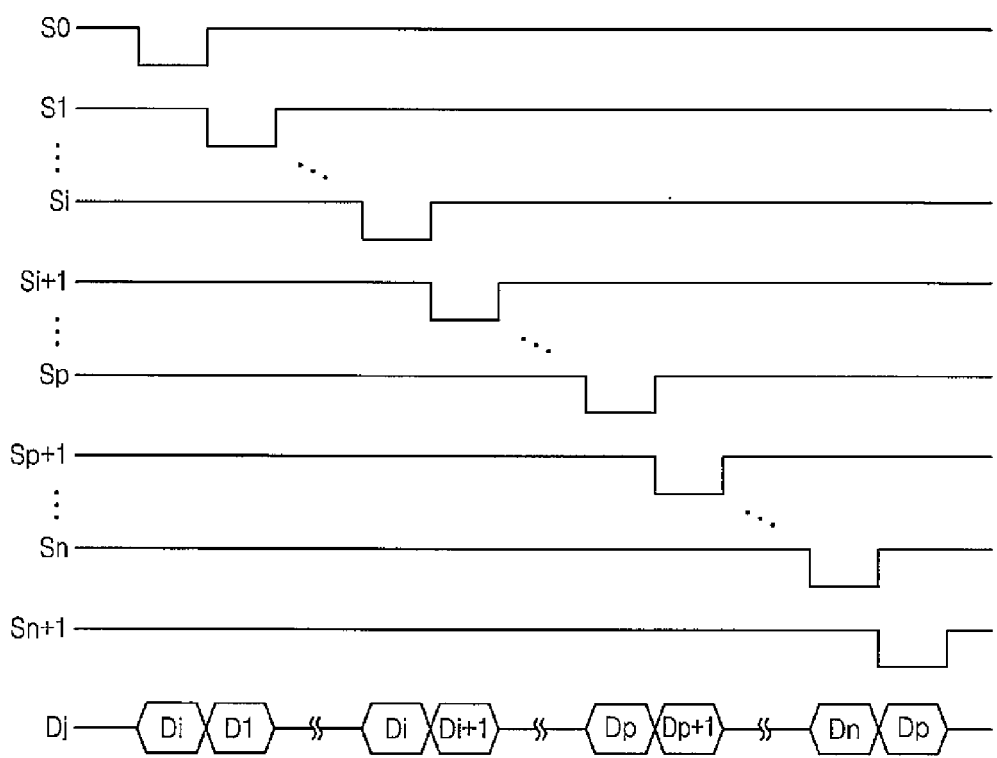
FIG. 14 shows waveforms of scan signals provided by a scan driving unit and data signals provided by a data driving unit of a display panel having pixels repaired by using the method of the embodiment illustrated in FIG. 13.

FIG. 14 shows waveforms of scan signals provided by a scan driving unit, and data signals provided by a data driving unit, of a display panel having pixels repaired using the method illustrated in FIG. 13. Referring to FIG. 14, in a scan period, zeroth through (n+1)th scan signals S0 through Sn+1 are sequentially provided to respective ones of zeroth through (n+1)th scan lines SL0 through SLn+1. First through nth data signals D1 through Dn are sequentially provided to a jth data line DLj in synchronization with the zeroth through (n+1)th scan signals S0 through Sn+1. In this case, a data signal Di, which is the same as the data signal Di to be later provided to a defective emission pixel EPi, is initially provided to a dummy pixel DP0. Also, a data signal Dp, which is the same as the data signal Dp provided to a defective emission pixel EPp is provided again to a dummy pixel DPn+1.

Accordingly, an OLED of the defective emission pixel EPi may receive a current corresponding to the data signal Di via a pixel circuit PC0 of the dummy pixel DP0 and a repair line RLj. Also, an OLED of the defective emission pixel EPp may receive a current corresponding to the data signal Dp via a pixel circuit PCn+1 of the dummy pixel DPn+1 and the repair line RLj. As such, in an emission period, all emission pixels (including the defective emission pixels EPi and EPp) may emit light (e.g., simultaneously emit light) and thus generation of a bright spot or a dark spot may be suppressed.

Figure 15:
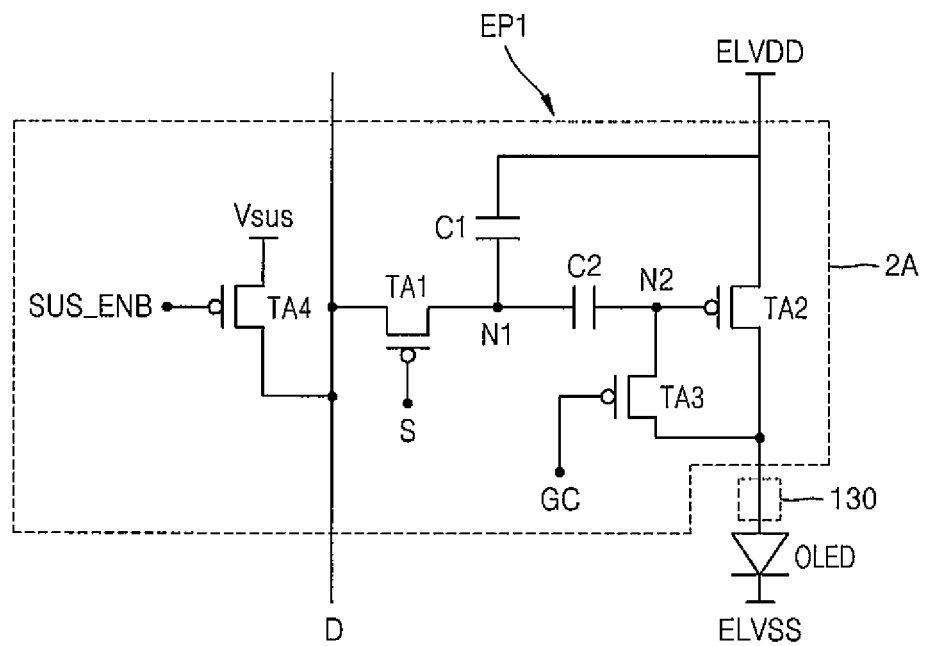
FIG. 15 is a circuit diagram of an emission pixel according to an embodiment of the present invention.
Figure 16:
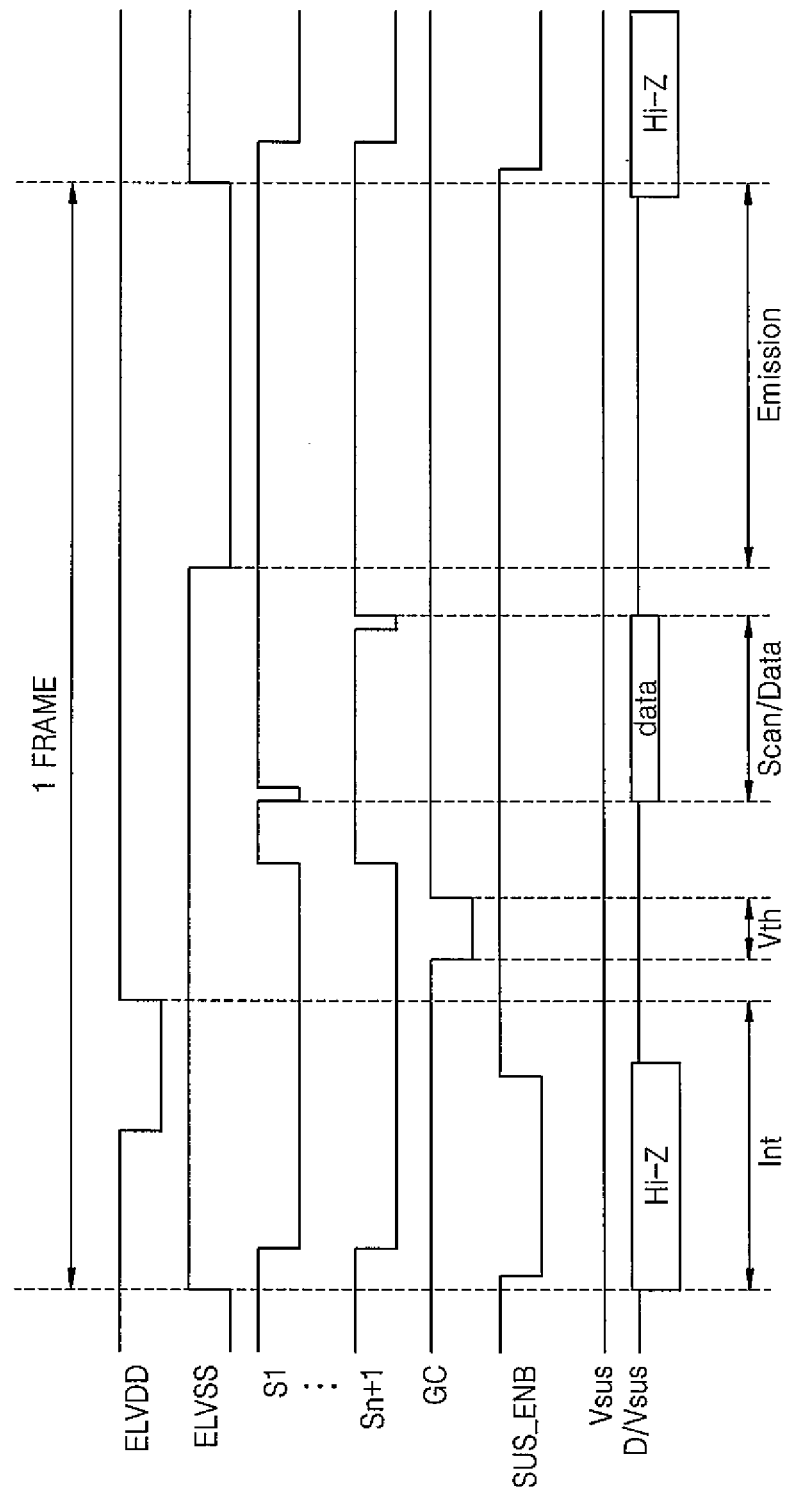
FIG. 16 is a timing diagram for describing a method of driving the emission pixel of the embodiment illustrated in FIG. 15.

FIG. 15 is a circuit diagram of an emission pixel EP1 according to an embodiment of the present invention. FIG. 16 is a timing diagram for describing a method of driving the emission pixel EP1 of the embodiment illustrated in FIG. 15.

Referring to FIG. 15, the emission pixel EP1 includes an OLED and a pixel circuit 2A for providing a current to the OLED. Although not shown in FIG. 15, a dummy pixel DP1 includes a pixel circuit 2A, but does not include an OLED.

An anode of the OLED is coupled to the pixel circuit 2A, and a cathode of the OLED is coupled to a second power source for providing a second power voltage ELVSS. The OLED emits light of a brightness corresponding to a current provided from the pixel circuit 2A. If the emission pixel EP1 is determined to be a defective pixel, a cutting unit 130 located at or near a location where the OLED is coupled to the pixel circuit 2A may be cut using a laser beam.

The pixel circuit 2A includes first through fourth transistors TA1 through TA4, and first and second capacitors C1 and C2.

A gate electrode of the first transistor TA1 receives a scan signal S from a scan line, and a first electrode of the first transistor TA1 receives a data signal D from a data line. A second electrode of the first transistor TA1 is coupled to a first node N1.

A gate electrode of the second transistor TA2 is coupled to a second node N2, a first electrode of the second transistor TA2 receives a first power voltage ELVDD from a first power source, and a second electrode of the second transistor TA2 is coupled to the anode of the OLED. The second transistor TA2 functions as a driving transistor.

The first capacitor C1 is coupled between the first node N1 and the first electrode of the second transistor TA2/the first power source. The second capacitor C2 is coupled between the first node N1 and the second node N2.

A gate electrode of the third transistor TA3 receives a first control signal GC, a first electrode of the third transistor TA3 is coupled to the gate electrode of the second transistor TA2, and a second electrode of the third transistor TA3 is coupled to the anode of the OLED and to the second electrode of the second transistor TA2.

A gate electrode of the fourth transistor TA4 receives a second control signal SUS_ENB, a first electrode of the fourth transistor TA4 receives an auxiliary voltage Vsus, and a second electrode of the fourth transistor TA4 is coupled to the data line and to the first electrode of the first transistor TA1.

In FIG. 16, it is assumed that the emission pixel EP1 and the dummy pixel DP1, each including the pixel circuit 2A illustrated in FIG. 15, are formed at the display panel 10a illustrated in FIG. 2, and are repaired using the method illustrated in FIG. 9.

Referring to FIG. 16, a plurality of emission pixels EP1 are driven using a simultaneous emission method, and operate by dividing each frame into an initialization period Int, a compensation period Vth, a scan/data input period Scan/Data, and an emission period Emission. In the scan/data input period Scan/Data, scan signals are sequentially input to a plurality of scan lines, and data signals corresponding to the scan signals are sequentially input to the emission pixels EP1 and the dummy pixel DP1.

In the initialization period Int and in the compensation period Vth, scan signals are provided (e.g., simultaneously provided) to all emission pixels EP1 and to the dummy pixel DP1. Initialization and threshold voltage compensation of a driving transistor included in each of the emission pixels EP1 and in the dummy pixel DP1, and light emission of each emission pixel EP1, are all performed in a frame.

In the initialization period Int, first through (n+1)th scan signals S1 through Sn+1 having a low level are simultaneously provided to all scan lines. The second control signal SUS_ENB having a low level is provided to the gate electrode of the fourth transistor TA4, and the data line is in a high impedance (Hi-Z) state. As such, the first transistor TA1 and the fourth transistor TA4 are turned on, and thus the auxiliary voltage Vsus having a high level is provided to the first node N1, a voltage of the second node N2 is reduced, and the second node N2 is maintained at an initialization voltage Vint. Then, the second control signal SUS_ENB changes from a low level to a high level, the fourth transistor TA4 is turned off, and the auxiliary voltage Vsus of the data line having a high level is provided to the first node N1. Since the voltage of the second node N2 is reduced, the second transistor TA2 is turned on, and a voltage of the anode of the OLED is reset to a level of the driving voltage ELVDD.

In the compensation period Vth, the auxiliary voltage Vsus having a high level, and which is provided to the data line, is provided to the first node N1. The first control signal GC is provided at a low level, and thus the third transistor TA3 is turned on. As such, the second transistor TA2 is diode-coupled, and thus a current flows until a voltage corresponding to a threshold voltage of the second transistor TA2 is stored in the second capacitor C2. After that, the second transistor TA2 is turned off.

In the scan/data input period Scan/Data, the first through (n+1)th scan signals S1 through Sn+1 having a low level are sequentially input to a plurality of scan lines, and thus the first transistor TA1 is turned on, and data signals are sequentially input to the emission pixels EP1 and the dummy pixel DP1 coupled to each scan line. Accordingly, a data signal, which is the same as the data signal provided to a defective emission pixel, is provided to the dummy pixel DP1. As such, a voltage difference between the driving voltage ELVDD and a voltage of the first node N1 is stored in the first capacitor C1.

In this case, a width of sequentially provided scan signals may be provided as two horizontal periods (2H), and widths of adjacent scan signals, for example, widths of the (n−1)th scan signal Sn−1 and the nth scan signal Sn, may overlap by one horizontal period (1H) or less. This is to improve a deficiency in charge caused by a resistive-capacitive (RC) delay of signal lines, which may occur due to a large-sized display area.

In the emission period Emission, the first power voltage ELVDD is provided at a high level, and the second power voltage ELVSS is provided at a low level. A current path from the first power voltage ELVDD to the cathode of the OLED is formed via the second transistor TA2, and OLEDs of all emission pixels EP1 emit light of a brightness corresponding to a data signal. In this case, an OLED of a defective pixel emits light due to a current provided from the dummy pixel DP1 via the repair line.

Although not shown in FIG. 16, after an emission period of an Nth frame, for black insertion or dimming before an (N+1)th frame starts, an emission off period for stopping light emission may be added.

Figure 17:
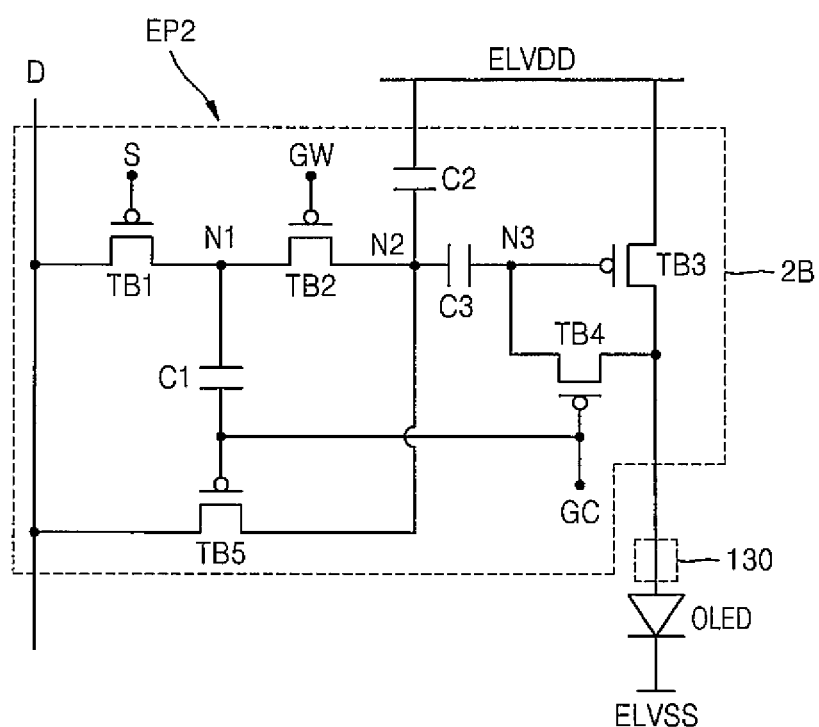
FIG. 17 is a circuit diagram of an emission pixel according to another embodiment of the present invention.
Figure 18:
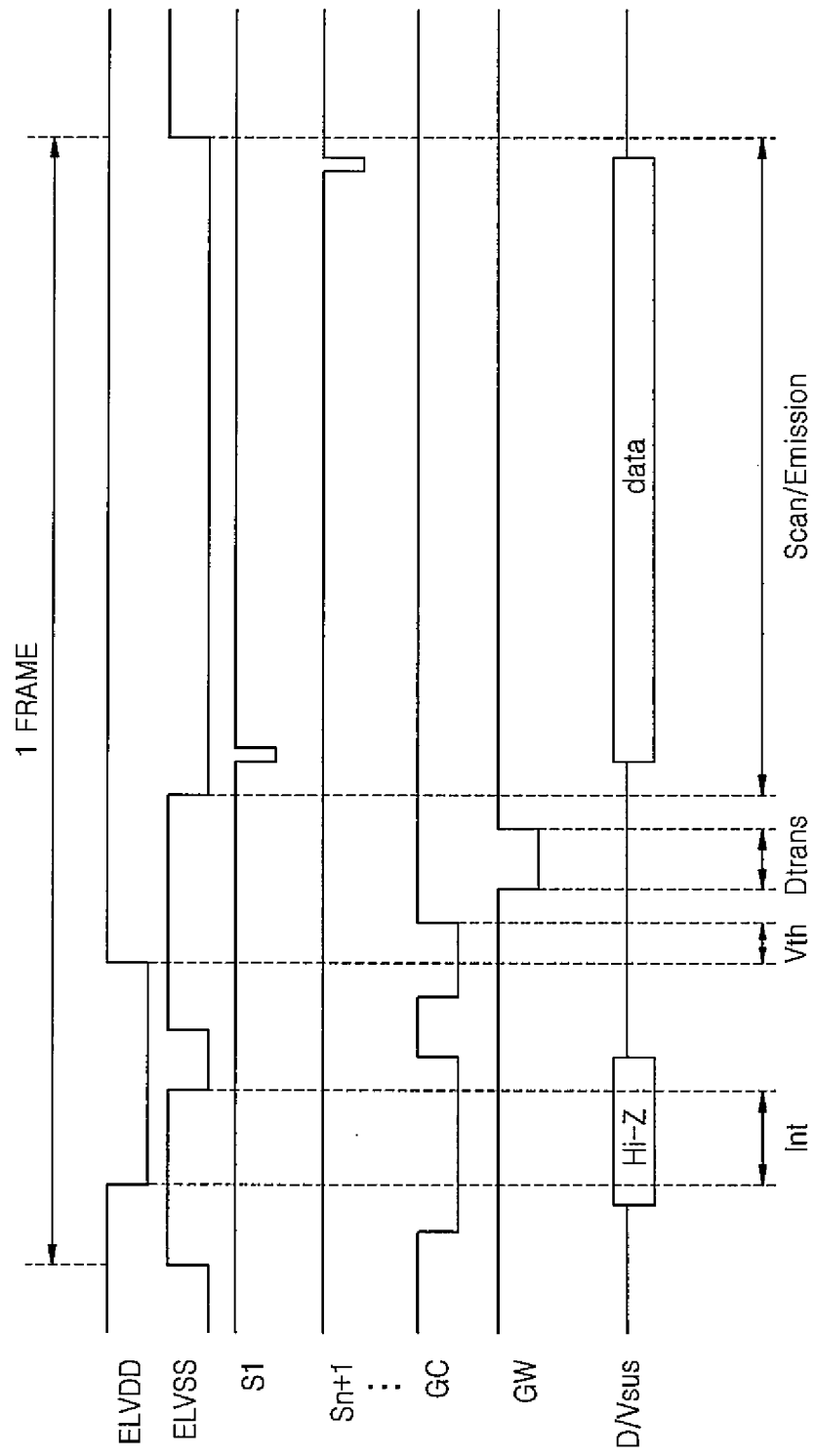
FIG. 18 is a timing diagram for describing a method of driving the emission pixel of the embodiment illustrated in FIG. 17.

FIG. 17 is a circuit diagram of an emission pixel EP2 according to another embodiment of the present invention. FIG. 18 is a timing diagram for describing a method of driving the emission pixel EP2 of the embodiment illustrated in FIG. 17.

Referring to FIG. 17, the emission pixel EP2 includes an OLED and a pixel circuit 2B for providing a current to the OLED. Although not shown in FIG. 17, a dummy pixel DP2 includes a pixel circuit 2B, but does not include an OLED.

An anode of the OLED is coupled to the pixel circuit 2B, and a cathode of the OLED is coupled to a second power source for providing a second power voltage ELVSS. The OLED emits light (e.g., emits light of a predetermined brightness) corresponding to a current provided from the pixel circuit 2B. If the emission pixel EP2 is determined as a defective pixel, a cutting unit 130, which is located at or near a region where the OLED is coupled to the pixel circuit 2B, is cut using a laser beam.

The pixel circuit 2B includes first through fifth transistors TB1 through TB5, and first through third capacitors C1 through C3.

A gate electrode of the first transistor TB1 receives a scan signal S from a scan line, and a first electrode of the first transistor TB1 is coupled to, and receives a data signal ID from, a data line. A second electrode of the first transistor TB1 is coupled to a first node N1.

A gate electrode of the second transistor TB2 receives a first control signal GW, a first electrode of the second transistor TB2 is coupled to the first node N1, and a second electrode of the second transistor TB2 is coupled to a second node N2.

A gate electrode of the third transistor TB3 is coupled to a third node N3, a first electrode of the third transistor TB3 receives a first power voltage ELVDD from a first power source, and a second electrode of the third transistor TB3 is coupled to the anode of the OLED. The third transistor TB3 functions as a driving transistor.

A gate electrode of the fourth transistor TB4 receives a second control signal GC, a first electrode of the fourth transistor TB4 is coupled to the third node N3 and to the gate electrode of the third transistor TB3, and a second electrode of the fourth transistor TB4 is coupled to the anode of the OLED.

A gate electrode of the fifth transistor TB5 receives the second control signal GC, a first electrode of the fifth transistor TB5 is coupled to, and receives the data signal D from, the data line, and a second electrode of the fifth transistor TB5 is coupled to the second node N2.

The first capacitor C1 is coupled between the first node N1 and the gate electrode of the fifth transistor TB5, the second capacitor C2 is coupled between the second node N2 and the first power source, and the third capacitor C3 is coupled between the second node N2, and the third node N3/the gate electrode of the third transistor TB3. When the first transistor TB1 is turned on, the first capacitor C1 charges a voltage corresponding to the data signal D provided from the data line.

In FIG. 18, it is assumed that the emission pixel EP2 and the dummy pixel DP2, each including the pixel circuit 2B of the embodiment illustrated in FIG. 17, are formed at the display panel 10a illustrated in FIG. 2, and are repaired using the method illustrated in FIG. 9.

Referring to FIG. 18, a plurality of emission pixels EP2 are driven by using a simultaneous emission method, and operate by dividing each frame into an initialization period Int, a compensation period Vth, a data transmission period Dtrans, and a scan/emission period Scan/Emission. In the scan/emission period Scan/Emission, scan signals are sequentially input to a plurality of scan lines, and data signals corresponding to the scan signals are sequentially input to the emission pixels EP2 and to the dummy pixel DP2. Initialization, threshold voltage compensation, and data transmission of a driving transistor included in each of the emission pixels EP2 and in the dummy pixel DP2, as well as light emission of each emission pixel EP2, are respectively performed in the divided periods of frames.

In the initialization period Int, the first power voltage ELVDD and the second control signal GC are provided at a low level. The data line is in a high impedance (Hi-Z) state. As such, the fifth transistor TB5 and the fourth transistor TB4 are turned on, and thus the third transistor TB3 is diode-coupled, and a voltage of the anode of the OLED and a voltage of the third node N3 are initialized to a level of the driving voltage ELVDD.

In the compensation period Vth, the second control signal GC is provided at a low level, and an auxiliary voltage Vsus having a high level is provided to the data line. As such, the fifth transistor TB5 is turned on, and thus the auxiliary voltage Vsus is provided to the second node N2. Also, the fourth transistor TB4 is turned on, and thus the third transistor TB3 is diode-coupled, and a current flows until a voltage corresponding to a threshold voltage of the third transistor TB3 is stored in the third capacitor C3. After that, the third transistor TB3 is turned off.

In the data transmission period Dtrans, the first power voltage ELVDD and the second power voltage ELVSS are provided at their respective high levels, and the first control signal GW is provided at a low level. As such, the second transistor TB2 is turned on, and thus the data signal D, which is written in the emission pixel EP2 in a scan period of an (N−1)th frame and stored in the first capacitor C1, moves to the second node N2. Accordingly, a voltage difference between the driving voltage ELVDD and a voltage of the second node N2 is stored in the second capacitor C2.

In the scan/emission period Scan/Emission, a scan period and an emission period are simultaneously performed. In the scan/emission period Scan/Emission, the first power voltage ELVDD is provided at a high level, and the second power voltage ELVSS is provided at a low level. Also, the first through (n+1)th scan signals S1 through Sn+1 having a low level are sequentially input to respective scan lines, and thus the first transistor TB1 is turned on, and data signals are sequentially input to the emission pixels EP2 and to the dummy pixel DP2 coupled to each scan line. In this case, a data signal, which is the same as the data signal provided to a defective pixel, is provided to the dummy pixel DP2. As such, a voltage corresponding to a data signal of an Nth frame is stored in the first capacitor C1.

The second transistor TB2 is turned off to block the first node N1 from the second node N2. Also, a current path from the first power voltage ELVDD to the cathode of the OLED is formed via the turned-on third transistor TB3, and the OLED emits light of a brightness corresponding to the data signal that is written in the emission pixel EP2 in the scan period of the (N−1)th frame and stored in the second capacitor C2. In this case, all emission pixels EP2 in the display area AA simultaneously emit light. The OLED of a defective pixel emits light due to a current provided from the dummy pixel DP2 via a repair line. That is, in the scan/emission period Scan/Emission, data signals of the Nth frame are sequentially input according to scan signals and, at the same time, all emission pixels EP2 in the display area AA emit light corresponding to data signals of the (N−1)th frame.

Here, a width of sequentially provided scan signals may be provided as two horizontal periods (2H), and widths of adjacent scan signals, for example, widths of the (n−1)th scan signal Sn−1 and the nth scan signal Sn, may overlap by one horizontal period (1H) or less. This is to solve lack of charges due to an RC delay of signal lines according to a large-sized display area.

Figure 19:
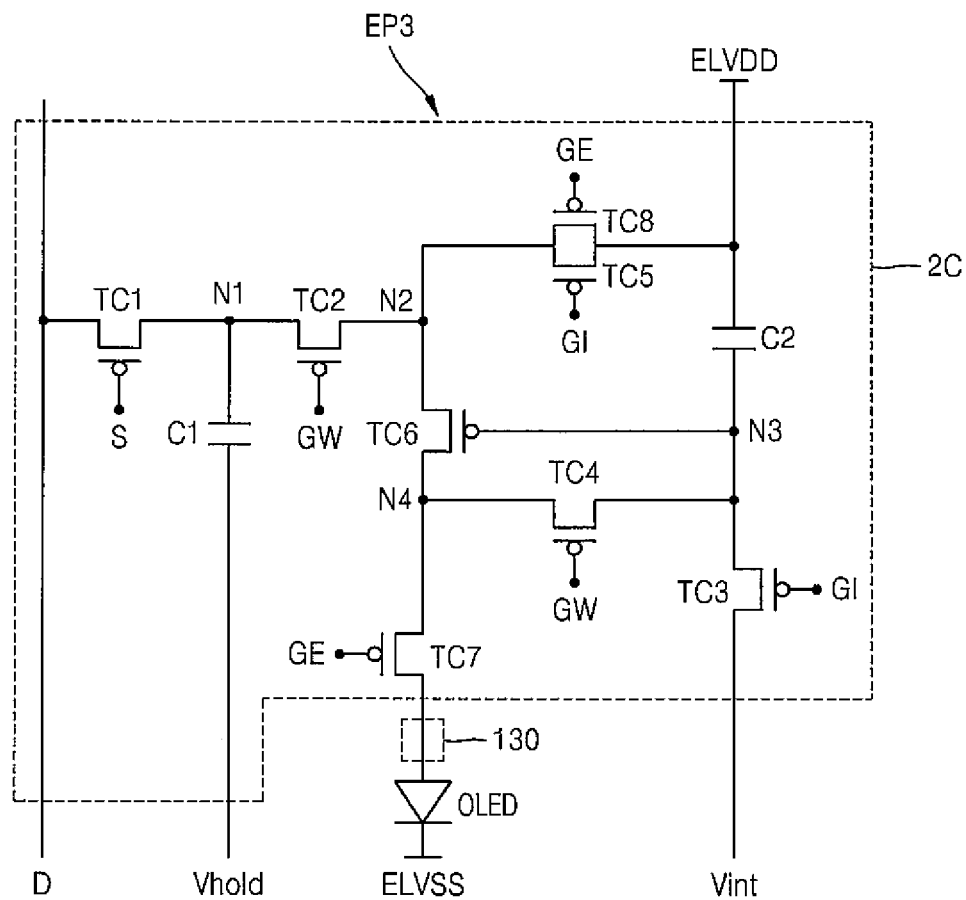
FIG. 19 is a circuit diagram of an emission pixel according to another embodiment of the present invention.
Figure 20:
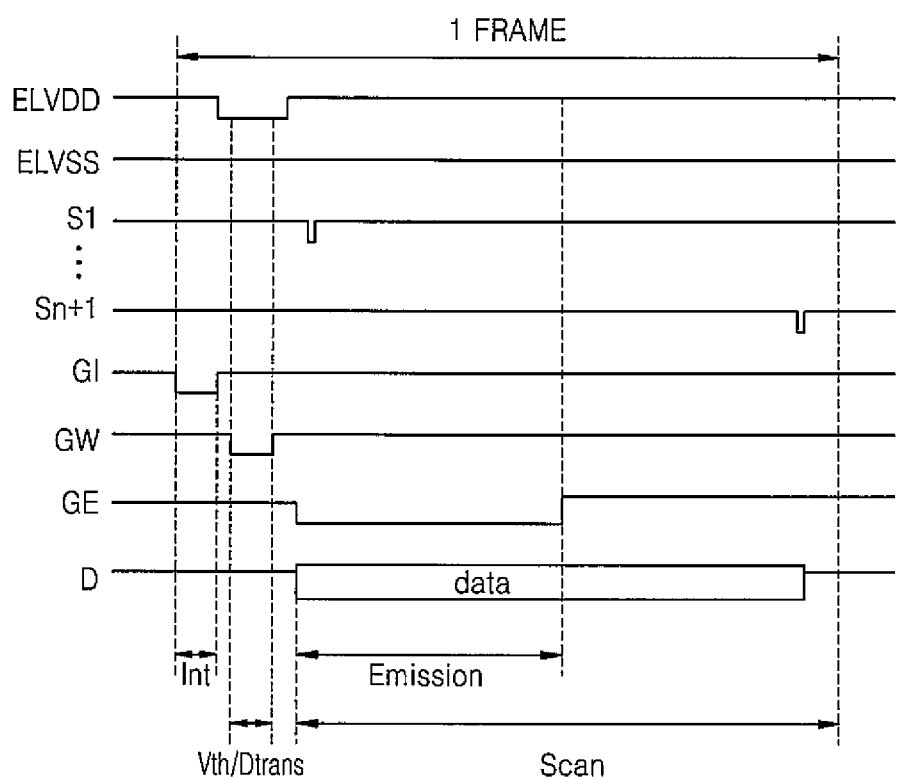
FIG. 20 is a timing diagram for describing a method of driving the emission pixel of the embodiment illustrated in FIG. 19.

FIG. 19 is a circuit diagram of an emission pixel EP3 according to another embodiment of the present invention. FIG. 20 is a timing diagram for describing a method of driving the emission pixel EP3 of the embodiment illustrated in FIG. 19.

Referring to FIG. 19, the emission pixel EP3 includes an OLED and a pixel circuit 2C for providing a current to the OLED. Although not shown in FIG. 19, a dummy pixel DP3 includes a pixel circuit 2C, but does not include an OLED.

An anode of the OLED is coupled to the pixel circuit 2C, and a cathode of the OLED is coupled to a second power source for providing a second power voltage ELVSS. The OLED emits light of a brightness corresponding to a current provided from the pixel circuit 2C. If the emission pixel EP3 is determined to be a defective pixel, a cutting unit 130, which is at or near a location where the OLED is coupled to the pixel circuit 2C, may be cut by using a laser beam.

The pixel circuit 2C includes first through eighth transistors TC1 through TC8, and first and second capacitors C1 and C2.

A gate electrode of the first transistor TC1 receives a scan signal S from a scan line, a first electrode of the first transistor TC1 is coupled to, and receives a data signal D from, a data line, and a second electrode of the first transistor TC1 is coupled to a first node N1.

A gate electrode of the second transistor TC2 receives a first control signal GW, a first electrode of the second transistor TC2 is coupled to the first node N1, and a second electrode of the second transistor TC2 is coupled to a second node N2.

A gate electrode of the third transistor TC3 receives a second control signal GI, a first electrode of the third transistor TC3 is coupled to, and receives an initialization voltage Vint from, an initialization power source, and a second electrode of the third transistor TC3 is coupled to a third node N3.

A gate electrode of the fourth transistor TC4 receives the first control signal GW, a first electrode of the fourth transistor TC4 is coupled to the third node N3, and a second electrode of the fourth transistor TC4 is coupled to a fourth node N4.

A gate electrode of the fifth transistor TC5 also receives the second control signal GI, a first electrode of the fifth transistor TC5 is coupled to, and receives a first power voltage ELVDD from, a first power source, and a second electrode of the fifth transistor TC5 is coupled to the second node N2.

A gate electrode of the sixth transistor TC6 is coupled to the third node N3, a first electrode of the sixth transistor TC6 is coupled to the second node N2, and a second electrode of the sixth transistor TC6 is coupled to the fourth node N4. The sixth transistor TC6 functions as a driving transistor.

A gate electrode of the seventh transistor TC7 receives a third control signal GE, a first electrode of the seventh transistor TC7 is coupled to the fourth node N4, and a second electrode of the seventh transistor TC7 is coupled to the anode of the OLED.

A gate electrode of the eighth transistor TC8 also receives the third control signal GE, a first electrode of the eighth transistor TC8 is coupled to, and receives the first power voltage ELVDD from, the first power source, and a second electrode of the eighth transistor TC8 is coupled to the second node N2.

The first capacitor C1 is coupled between the first node N1 and a third power source for providing a third power voltage Vhold. When the first transistor TC1 is turned on, the first capacitor C1 receives/charges a voltage corresponding to the data signal D provided from the data line. The third power source may be a power source of a fixed voltage (for example, a direct current power source). For example, the third power source may be set as the first power source for providing the first power voltage ELVDD, or as the initialization power source for providing the initialization voltage Vint. The second capacitor C2 is coupled between the third node N3 and the first power source.

In FIG. 20, it is assumed that the emission pixel EP3 and the dummy pixel DP3, each of which including the pixel circuit 2C illustrated in FIG. 19, are formed at the display panel 10a illustrated in FIG. 2, and are repaired by using the method illustrated in FIG. 9.

Referring to FIG. 20, a plurality of emission pixels EP3 are driven by using a simultaneous emission method, and operate by dividing each frame into an initialization period Int, a compensation/data transmission period Vth/Dtrans, and a scan/emission period Scan/Emission. In the scan/emission period Scan/Emission, scan signals are sequentially input to a plurality of scan lines, and data signals corresponding to the scan signals are sequentially input to the emission pixels EP3 and to the dummy pixel DP3. Initialization, threshold voltage compensation, and data transmission of a driving transistor included in each of the emission pixels EP3 and the dummy pixel DP3, as well as light emission of each emission pixel EP3, are all performed in respective periods of a given frame.

In the initialization period Int (e.g., at the beginning of the initialization period Int), the first power voltage ELVDD is provided at a high level, and the second power voltage ELVSS and the second control signal GI are provided at a low level. As such, the third transistor TC3 and the fifth transistor TC5 are turned on, and thus the first power voltage ELVDD is provided to the second node N2, and the initialization voltage Vint is provided to the third node N3.

In the compensation/data transmission period Vth/Dtrans, the first power voltage ELVDD, the second power voltage ELVSS, and the first control signal GW are provided at a low level. As such, the second transistor TC2 is turned on, and thus the data signal D, which is written in the emission pixel EP3 in a scan period of an (N−1)th frame and stored in the first capacitor C1, moves to the second node N2. Also, the fourth transistor TC4 is turned on, and thus the sixth transistor TC6 is diode-coupled, causing a current to flow therethrough, and thus a threshold voltage of the sixth transistor TC6 is compensated, and a voltage difference between the driving voltage ELVDD and a voltage of the second node N2 is stored in the second capacitor C2.

In the scan/emission period Scan/Emission, a scan period and an emission period are simultaneously performed. In the scan/emission period Scan/Emission, the first power voltage ELVDD is provided at a high level, and the second power voltage ELVSS and the third control signal GE are provided at a low level (e.g., the third control signal GE is provided at a low level at the beginning of the scan/emission period Scan/Emission, during the emission period Emission of the scan/emission period Scan/Emission).

Also during the scan/emission period Scan/Emission, the first through (n+1)th scan signals S1 through Sn+1 having a low level are sequentially input to respective scan lines, and thus the first transistor TC1 is turned on, and data signals of an Nth frame are sequentially input to the emission pixels EP3 coupled to each scan line. In this case, a data signal, which is the same as the data signal provided to a defective pixel and to the emission pixels EP3, is provided to the dummy pixel DP3. As such, a voltage corresponding to the data signal of the Nth frame is stored in the first capacitor C1.

The second transistor TC2 is turned off to block/electrically isolate the first node N1 from the second node N2. Also, the seventh and eighth transistors TC7 and TC8 are turned on, and thus a current path from the first power voltage ELVDD to the cathode of the OLED is formed via the turned-on sixth, seventh, and eighth transistors TC6, TC7, and TC8, and the OLED emits light of a brightness corresponding to a data signal written in the emission pixel EP3 in the scan period of the (N−1)th frame and stored in the second capacitor C2. In this case, all emission pixels EP3 in the display area AA simultaneously emit light. The OLED of a defective pixel emits light due to a current provided from the dummy pixel DP3 via a repair line. That is, in the scan/emission period Scan/Emission, data signals of the Nth frame are sequentially input according to the scan signals and, at the same time, all emission pixels EP3 in the display area AA simultaneously emit light corresponding to data signals of the (N−1)th frame. The emission period Emission may partially overlap the scan period Scan, and may be shorter than the scan period Scan.

Here, a width of sequentially provided scan signals may be provided as two horizontal periods (2H), and widths of adjacent scan signals, for example, widths of the (n−1)th scan signal Sn−1 and the nth scan signal Sn, may overlap by one horizontal period (1H) or less. This helps to avoid a problem of insufficient/lacking charge, which may be caused by an RC delay of signal lines in a large-sized display area.

Figure 21:
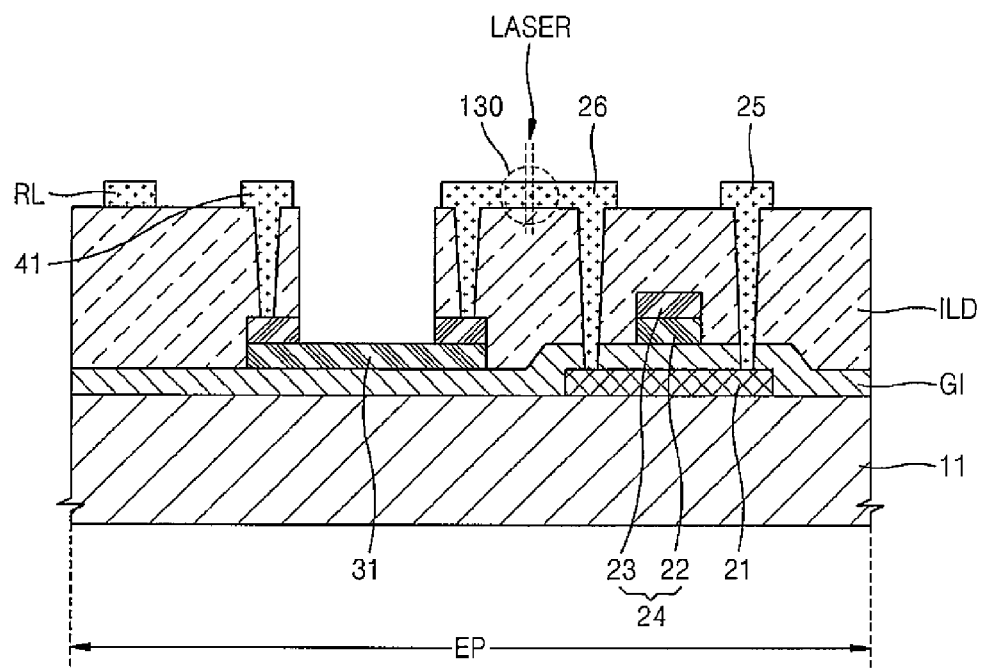
FIGS. 21 and 22 are cross-sectional diagrams for describing a method of repairing an emission pixel in a bottom emission display device, according to an embodiment of the present invention.
Figure 22:
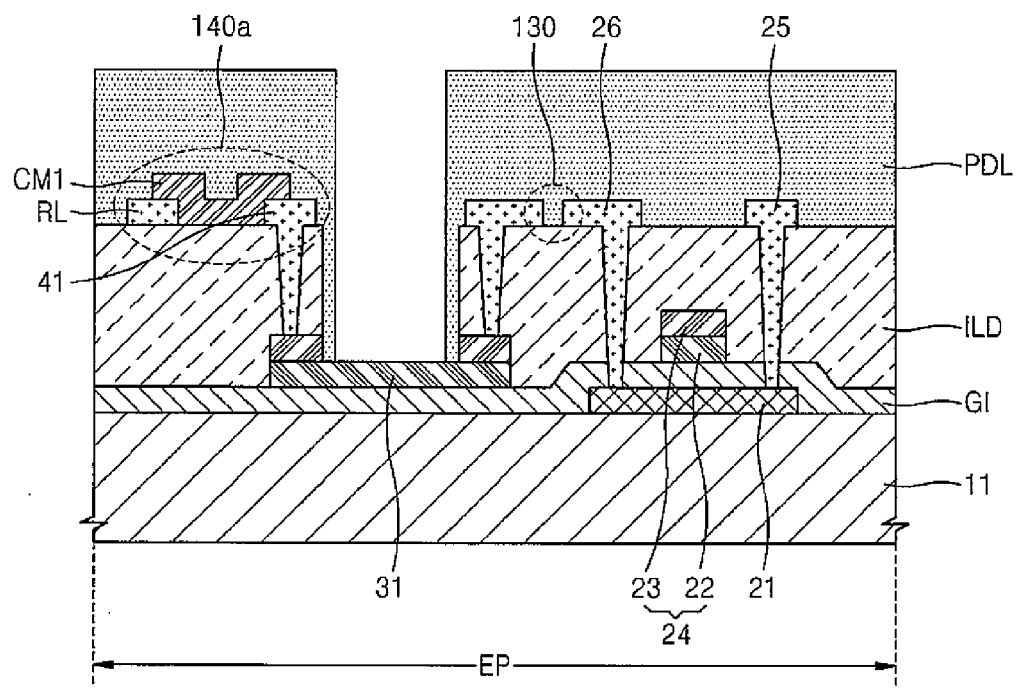

FIGS. 21 and 22 are cross-sectional diagrams for describing a method of repairing an emission pixel EP in a bottom emission display device, according to an embodiment of the present invention.

In FIGS. 21 and 22, for convenience of explanation, only a pixel electrode 31 for forming an OLED in each emission pixel EP, and a TFT coupled to the pixel electrode 31 in a pixel circuit, are illustrated. The TFT may be the second transistor TA2 of the pixel circuit 2A illustrated in FIG. 15, the third transistor TB3 of the pixel circuit 2B illustrated in FIG. 17, or the seventh transistor TC7 of the pixel circuit 2C illustrated in FIG. 19.

Referring to FIG. 21, an active layer 21 of the TFT is formed on a substrate 11. Although not shown in FIG. 21, an auxiliary layer(s) for preventing diffusion of impurity ions, for preventing penetration of moisture or external air, and for planarizing the surface, for example, a barrier layer, a blocking layer, and/or a buffer layer, may be further formed on a top surface of the substrate 11.

The active layer 21 may include a semiconductor, and may include doped ion impurities. Also, the active layer 21 may be formed of an oxide semiconductor. The active layer 21 includes source and drain regions and a channel region.

A gate insulating layer GI is formed on the substrate 11 on which the active layer 21 is formed. A gate electrode 24 and the pixel electrode 31 are formed on the gate insulating layer GI. The gate electrode 24 is formed to correspond to the channel region of the active layer 21.

The gate electrode 24 and the pixel electrode 31 are formed by sequentially stacking and then etching first and second conductive layers on the gate insulating layer GI. The gate electrode 24 may include a first gate electrode 22 formed of a part of the first conductive layer, and a second gate electrode 23 formed of a part of the second conductive layer. The pixel electrode 31 may be formed of a part of the first conductive layer that is exposed after the second conductive layer is partially removed. An interlayer insulating layer ILD is formed on the substrate 11 on which the gate electrode 24 and the pixel electrode 31 are formed.

Source and drain electrodes 25 and 26, which respectively contact the source and drain regions of the active layer 21 through contact holes, are formed on the interlayer insulating layer ILD. One of the source and drain electrodes 25 and 26 contacts/is electrically coupled to the pixel electrode 31 through a contact hole above a part of the second conductive layer that remains on an edge region of the pixel electrode 31. Also, a repair line RL and a first connection unit 41 formed of a conductive material are formed on the interlayer insulating layer ILD. The first connection unit 41 is electrically coupled to the pixel electrode 31 by contacting a part of the second conductive layer that remains on an edge region of the pixel electrode 31 (e.g., opposite the edge region of the pixel electrode contacting the source or drain electrode 25 or 26). The repair line RL and the first connection unit 41 may be formed of the same material as, or of a different material from, the source and drain electrodes 25 and 26.

After a backplane is formed as described above, if the pixel circuit is tested and is determined to be defective, the TFT is electrically separated from the pixel electrode 31 by irradiating a laser beam onto a cutting unit 130, which otherwise couples one of the source and drain electrodes 25 and 26 to the pixel electrode 31. As such, the pixel circuit of the defective emission pixel EP is electrically separated from the pixel electrode 31.

Referring to FIG. 22, in a first repairing unit 140a, the repair line RL is electrically coupled to the pixel electrode 31 via the first connection unit 41 by forming first contact metal CM1 on the repair line RL and the first connection unit 41. The first contact metal CM1 may be formed by using a method such as chemical vapor deposition (CVD). After being repaired, a pixel defining layer PDL having a hole for exposing the pixel electrode 31 is formed on the substrate 11 on which the first contact metal CM1 is formed.

Then, an organic layer including an emission layer, and a counter electrode are sequentially formed on the pixel electrode 31. If the organic layer emits red light, green light, or blue light, the emission layer may be patterned as a red emission layer, a green emission layer, or a blue emission layer, respectively. Otherwise, if the organic layer emits white light, the emission layer may have a multilayer structure in which a red emission layer, a green emission layer, and a blue emission layer are stacked to emit white light, or a monolayer structure including a red emission material, a green emission material, and a blue emission material. The counter electrode may be deposited on the entire surface of the substrate 11, and thus may be formed as a common electrode. According to an embodiment of the present invention, the pixel electrode 31 is used as an anode, and the counter electrode is used as a cathode. The polarities of the pixel electrode 31 and the counter electrode may be switched.

Figure 23:
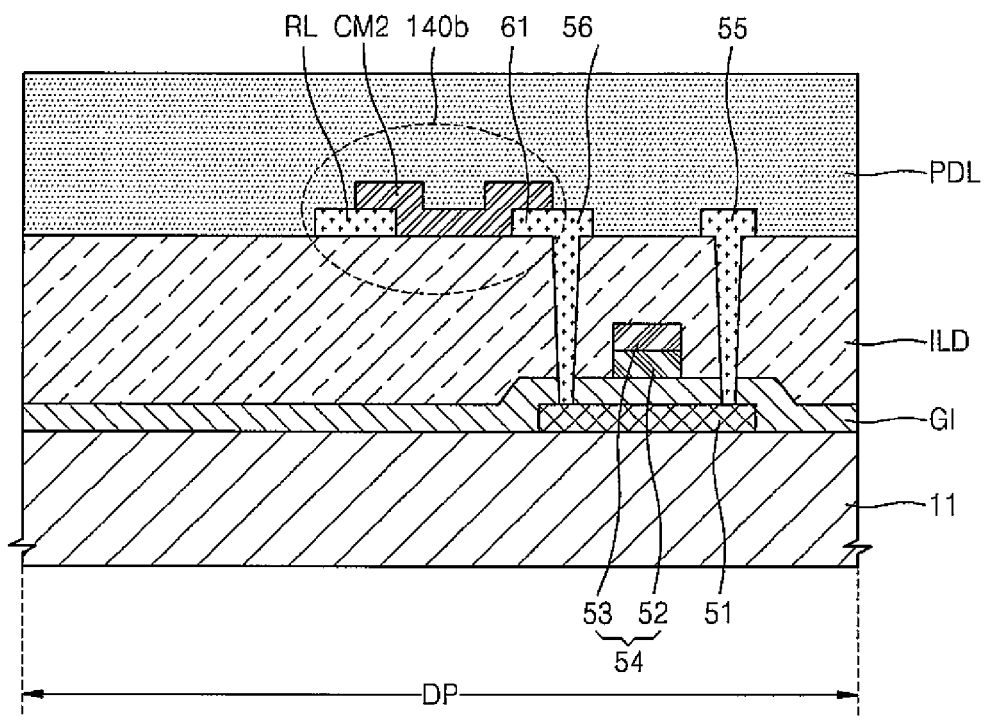
FIG. 23 is a cross-sectional diagram for describing a method of coupling a dummy pixel in a bottom emission display device, according to an embodiment of the present invention.

FIG. 23 is a cross-sectional diagram for describing a method of coupling a dummy pixel DP in a bottom emission display device, according to an embodiment of the present invention.

In FIG. 23, for convenience of explanation, only a TFT coupled to a repair line RL in a pixel circuit of the dummy pixel DP is illustrated. The pixel circuit of the dummy pixel DP may be formed simultaneously with, and may be formed of the same material as, the pixel circuit of the emission pixel EP illustrated in FIGS. 21 and 22. Accordingly, the TFT illustrated in FIG. 23 may be the second transistor TA2 of the pixel circuit 2A illustrated in FIG. 15, the third transistor TB3 of the pixel circuit 2B illustrated in FIG. 17, or the seventh transistor TC7 of the pixel circuit 2C illustrated in FIG. 19.

Referring to FIG. 23, an active layer 51 of the TFT is formed on a substrate 11. The active layer 51 may include a semiconductor and may include doped ion impurities. Also, the active layer 51 may be formed of an oxide semiconductor. The active layer 51 includes source and drain regions, and a channel region therebetween. A gate insulating layer GI is formed on the substrate 11 on which the active layer 51 is formed. A gate electrode 54 is formed on the gate insulating layer GI.

The gate electrode 54 is formed at a position corresponding to the channel region of the active layer 51. The gate electrode 54 is formed by sequentially stacking and then etching first and second conductive layers on the gate insulating layer GI. The gate electrode 54 may include a first gate electrode 52 formed of a part of the first conductive layer, and a second gate electrode 53 formed of a part of the second conductive layer. An interlayer insulating layer ILD is formed on the substrate 11 on which the gate electrode 54 is formed.

Source and drain electrodes 55 and 56 respectively contacting the source and drain regions of the active layer 51 through contact holes are formed on the interlayer insulating layer ILD. Also, the repair line RL and a second connection unit 61 formed of a conductive material is formed on the interlayer insulating layer ILD. The second connection unit 61 may extend from one of the source and drain electrodes 55 and 56. The repair line RL may be formed of the same material as, or of a different material from, the source and drain electrodes 55 and 56.

In a second repairing unit 140b, the repair line RL is electrically coupled to the second connection unit 61 by forming second contact metal CM2 on the repair line RL and the second connection unit 61. The second contact metal CM2 may be formed simultaneously with, and may be formed of the same material as, the first contact metal CM1, and may be formed using a method such as CVD. A pixel defining layer PDL is formed on the substrate 11 on which the second contact metal CM2 is formed.

According to an embodiment of the present invention, if a pixel circuit of an emission pixel is defective when a backplane is formed, to solve a bright spot due to the defective pixel circuit, connection between a pixel electrode of the emission pixel and a TFT of the emission pixel is cut, and a connection unit coupled to the pixel electrode is coupled to a repair line. The repair line coupled to the pixel electrode of the emission pixel is also coupled to a pixel circuit of a dummy pixel. As such, a data signal, which is the same as the data signal input to the pixel circuit of the emission pixel, may be input to the pixel circuit of the dummy pixel, and an emission device of the emission pixel may emit light of a brightness corresponding to the input data signal.

Figure 24:
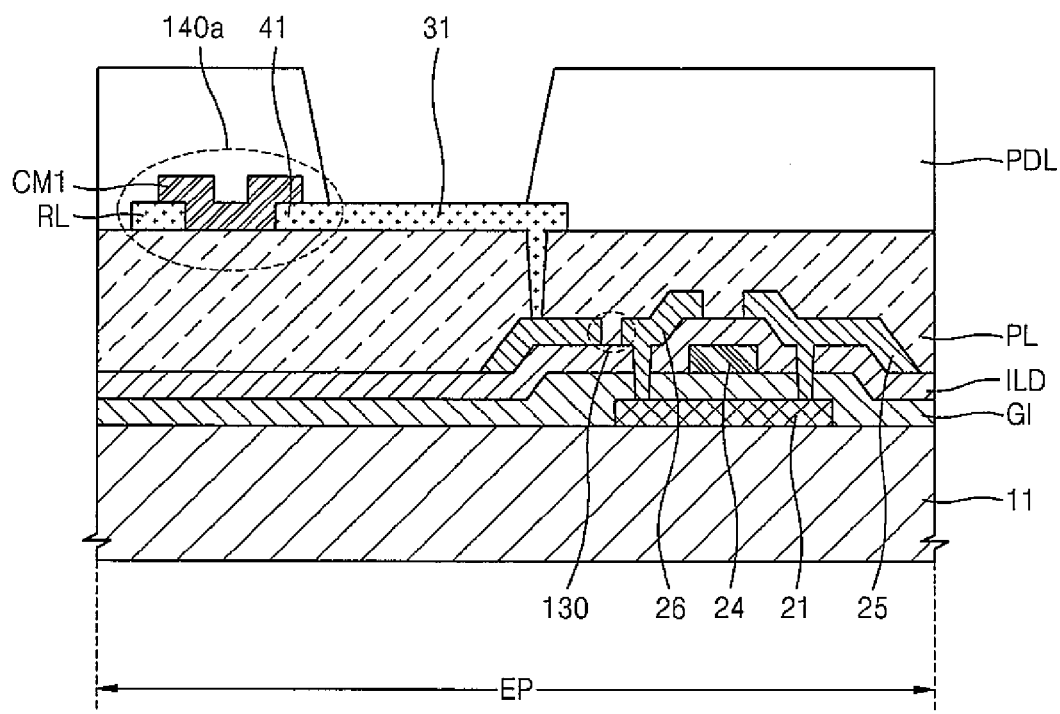
FIG. 24 is a cross-sectional diagram for describing a method of repairing an emission pixel in a top emission display device, according to an embodiment of the present invention.
Figure 25:
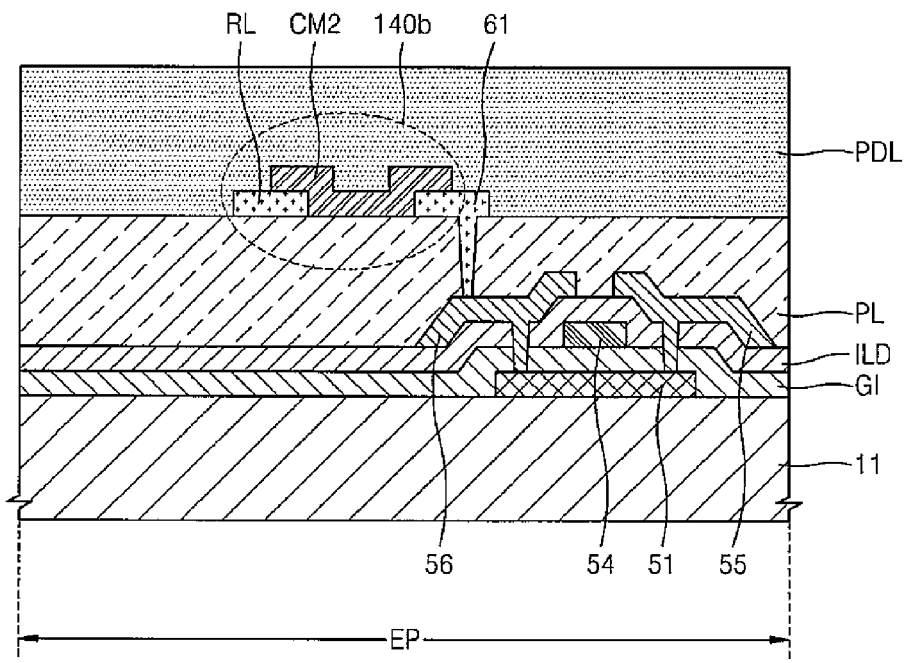
FIG. 25 is a cross-sectional diagram for describing a method of coupling a dummy pixel in a top emission display device, according to an embodiment of the present invention.

FIG. 24 is a cross-sectional diagram for describing a method of repairing an emission pixel EP in a top emission display device, according to an embodiment of the present invention. FIG. 25 is a cross-sectional diagram for describing a method of coupling a dummy pixel EP in a top emission display device, according to an embodiment of the present invention.

In FIGS. 24 and 25, for convenience of explanation, only a TFT coupled to a repair line RL in a pixel circuit of the emission pixel EP or of the dummy pixel DP is illustrated.

Referring to FIGS. 24 and 25, an active layer 21 of the TFT of the emission pixel EP (FIG. 24), and an active layer 51 of the TFT of the dummy pixel DP (FIG. 25) are formed on a substrate 11. Although not shown in FIGS. 24 and 25, an auxiliary layer(s) for preventing diffusion of impurity ions, for preventing penetration of moisture or external air, and for planarizing the surface, for example, a barrier layer, a blocking layer, and/or a buffer layer, may also be formed on a top surface of the substrate 11.

The active layers 21 and 51 may include a semiconductor, and may include doped ion impurities. Also, the active layers 21 and 51 may be formed of an oxide semiconductor. Each of the active layers 21 and 51 includes source and drain regions, and a channel region therebetween. A gate insulating layer GI is formed on the substrate 11 on which the active layers 21 and 51 are formed.

A gate electrode 24 of the emission pixel EP, and a gate electrode 54 of the dummy pixel DP, are formed on the gate insulating layer GI. The gate electrodes 24 and 54 may be formed to respectively correspond to the channel regions of the active layers 21 and 51. An interlayer insulating layer ILD is formed on the substrate 11 on which the gate electrodes 24 and 54 are formed.

Source and drain electrodes 25 and 26, and 55 and 56, which respectively contact the source and drain regions of the active layers 21 and 51 through contact holes, are formed on the interlayer insulating layer ILD. A planarization layer PL is formed on the substrate 11 on which the source and drain electrodes 25 and 26, and 55 and 56 are formed. The planarization layer PL may be formed to have an embossed surface on a region corresponding to a pixel electrode 31.

The pixel electrode 31 and a first connection unit 41 of the emission pixel EP, a repair line RL, and a second connection unit 61 of the dummy pixel DP coupled to one of the source and drain electrodes 55 and 56, are formed on the planarization layer PL. The first connection unit 41 may extend from the pixel electrode 31. The repair line RL may be formed adjacent to the pixel electrode 31. The repair line RL, the second connection unit 61, and the pixel electrode 31 may be formed of the same material or of different materials. The pixel electrode 31 may have an embossed structure according to the shape of the planarization layer PL.

After a backplane is formed as described above, if the pixel circuit is tested and is determined as being defective, the TFT of the emission pixel EP is electrically separated from the pixel electrode 31 by irradiating a laser beam onto a cutting unit 130, which otherwise couples one of the source and drain electrodes 25 and 26 to the pixel electrode 31. As such, the pixel circuit of the defective emission pixel EP is electrically separated from the pixel electrode 31.

Also, in a first repairing unit 140a, the repair line RL is electrically coupled to the first connection unit 41 by using first contact metal CM1. Furthermore, in a second repairing unit 140b, the repair line RL is electrically coupled to the second connection unit 61 by using second contact metal CM2. The first contact metal CM1 may be formed simultaneously with (e.g., during the same process as), and may be formed of the same material as, the second contact metal CM2 by using a method such as CVD. After being repaired, a pixel defining layer PDL is formed on the substrate 11 on which the first contact metal CM1 and the second contact metal CM2 are formed.

Although not shown in FIGS. 24 and 25, an organic layer including an emission layer, and a counter electrode are formed on the pixel electrode 31. Like the pixel electrode 31, the organic layer and the counter electrode may also have an embossed structure according to the shape of the planarization layer PL. In this case, if elements located in a proceeding direction of light emitted from an emission layer have embossed surfaces, although a total reflection condition is satisfied and thus total reflection occurs, an incident angle of reflected light may vary, and thus continuous total reflection in one element might not occur. Accordingly, the amount of light transmitted toward a user may be increased, and thus the efficiency of light may be maximized.

Figure 26:
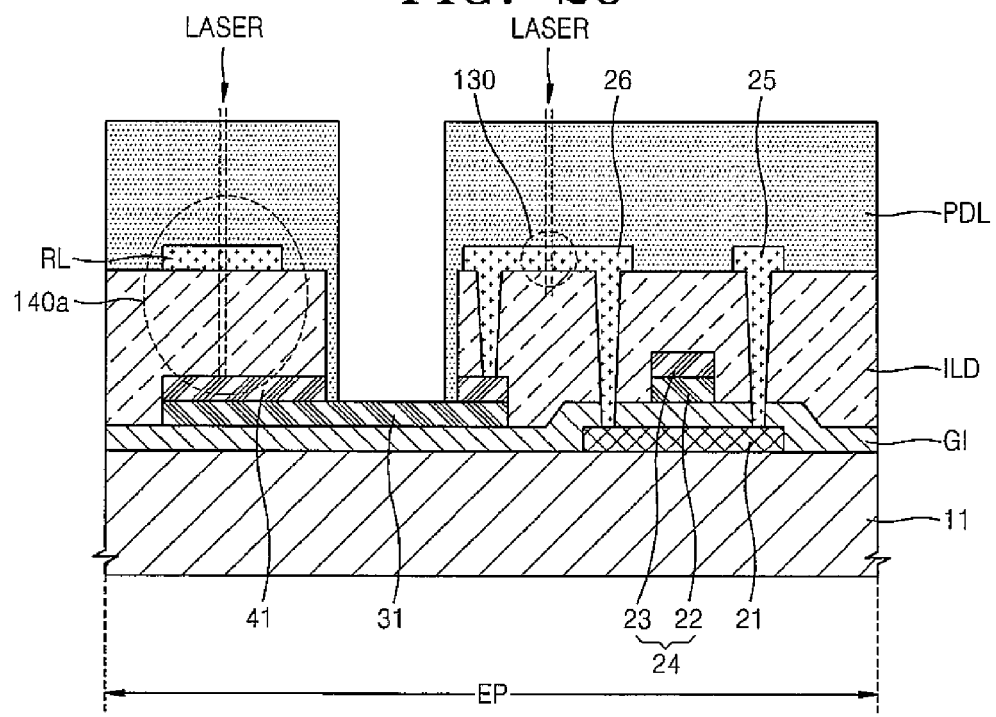
FIG. 26 is a cross-sectional diagram for describing a method of repairing an emission pixel in a bottom emission display device, according to another embodiment of the present invention.
Figure 27:
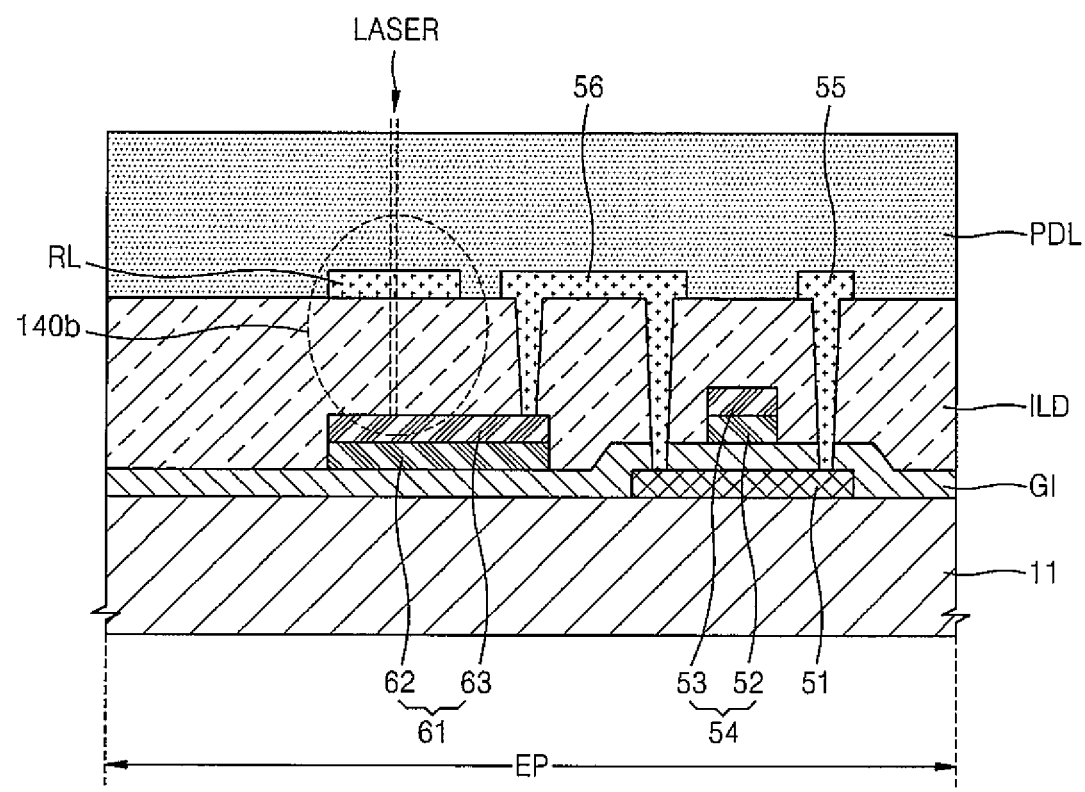
FIG. 27 is a cross-sectional diagram for describing a method of coupling a dummy pixel in a bottom emission display device, according to another embodiment of the present invention.

FIG. 26 is a cross-sectional diagram for describing a method of repairing an emission pixel EP in a bottom emission display device, according to another embodiment of the present invention. FIG. 27 is a cross-sectional diagram for describing a method of coupling a dummy pixel DP in a bottom emission display device, according to another embodiment of the present invention.

In FIGS. 26 and 27, for convenience of explanation, only a TFT coupled to a repair line RL in a pixel circuit of the emission pixel EP or of the dummy pixel DP is illustrated. FIGS. 26 and 27 show a case that repairing is performed after performing a vision test of a display panel.

Referring to FIGS. 26 and 27, an active layer 21 of the TFT of the emission pixel EP, and an active layer 51 of the TFT of the dummy pixel DP, are formed on a substrate 11. Although not shown in FIGS. 26 and 27, an auxiliary layer(s) for preventing diffusion of impurity ions, for preventing penetration of moisture or external air, and for planarizing the surface, for example, a barrier layer, a blocking layer, and/or a buffer layer, may be further formed on a top surface of the substrate 11.

The active layers 21 and 51 may include a semiconductor and may include doped ion impurities. Also, the active layers 21 and 51 may be formed of an oxide semiconductor. Each of the active layers 21 and 51 includes source and drain regions, and a channel region therebetween. A gate insulating layer GI is formed on the substrate 11 on which the active layers 21 and 51 are formed.

A gate electrode 24 of the emission pixel EP and a gate electrode 54 of the dummy pixel DP are formed on the gate insulating layer GI. The gate electrodes 24 and 54 may be formed to respectively correspond to the channel regions of the active layers 21 and 51. The gate electrodes 24 and 54 are formed by sequentially stacking and then etching first and second conductive layers on the gate insulating layer GI. The gate electrode 24 and 54 may respectively include first gate electrodes 22 and 52 formed of parts of the first conductive layer, and second gate electrodes 23 and 53 formed of parts of the second conductive layer.

Also, a pixel electrode 31 and a first connection unit 41 of the emission pixel EP, and a second connection unit 61 of the dummy pixel DP, are formed on the gate insulating layer GI. The pixel electrode 31 may be formed of a part of the first conductive layer exposed after the second conductive layer is partially removed. The first connection unit 41 may extend from the pixel electrode 31, and may be a part of the first and second conductive layers. The second connection unit 61 may include a first layer 62 formed of a part of the first conductive layer, and a second layer 63 formed of a part of the second conductive layer. An interlayer insulating layer ILD is formed on the substrate 11 on which the gate electrodes 24 and 54 and the first and second connection units 41 and 61 are formed.

Source and drain electrodes 25 and 26, and 55 and 56, respectively contacting the source and drain regions of the active layers 21 and 51 through contact holes, are formed on the interlayer insulating layer ILD. Also, the repair line RL is formed on the interlayer insulating layer ILD to at least partially overlap the first and second connection units 41 and 61. A pixel defining layer PDL is formed on the substrate 11 on which the source and drain electrodes 25 and 26, and 55 and 56, and the repair line RL are formed.

In the emission pixel EP that is detected as a defective pixel after a vision test, the TFT of the emission pixel EP is electrically separated from the pixel electrode 31 by irradiating a laser beam onto a cutting unit 130 to thereby cut the cutting unit 130, which is otherwise for coupling one of the source and drain electrodes 25 and 26 to the pixel electrode 31. As such, the pixel circuit of the defective emission pixel EP is electrically separated from the pixel electrode 31.

Also, laser welding is performed by irradiating a laser beam onto a first repairing unit 140a of the emission pixel EP. As such, the interlayer insulating layer ILD between the repair line RL and the first connection unit 41 is broken, and thus the repair line RL is electrically coupled to the first connection unit 41. Also, laser welding is performed by irradiating a laser beam onto a second repairing unit 140b of the dummy pixel DP. As such, the interlayer insulating layer ILD between the repair line RL and the second connection unit 61 is broken, and thus the repair line RL is electrically coupled to the second connection unit 61.

Before or after a vision test, an organic layer including an emission layer, and a counter electrode are sequentially formed on the pixel electrode 31. If the organic layer emits red light, green light, or blue light, the emission layer may be respectively patterned as a red emission layer, a green emission layer, or a blue emission layer. Otherwise, if the organic layer emits white light, the emission layer may have a multi-layer structure in which a red emission layer, a green emission layer, and a blue emission layer are stacked to emit white light, or a monolayer structure including a red emission material, a green emission material, and a blue emission material. The counter electrode may be deposited on the entire surface of the substrate 11, and thus may be formed as a common electrode. According to an embodiment of the present invention, the pixel electrode 31 is used as an anode and the counter electrode is used as a cathode. The polarities of the pixel electrode 31 and the counter electrode may be switched.

According to an embodiment of the present invention, when a certain circuit is defective, repairing may be simply performed using a repair line and laser welding, and thus a manufacturing yield rate of a display device may be improved.

Figure 28:
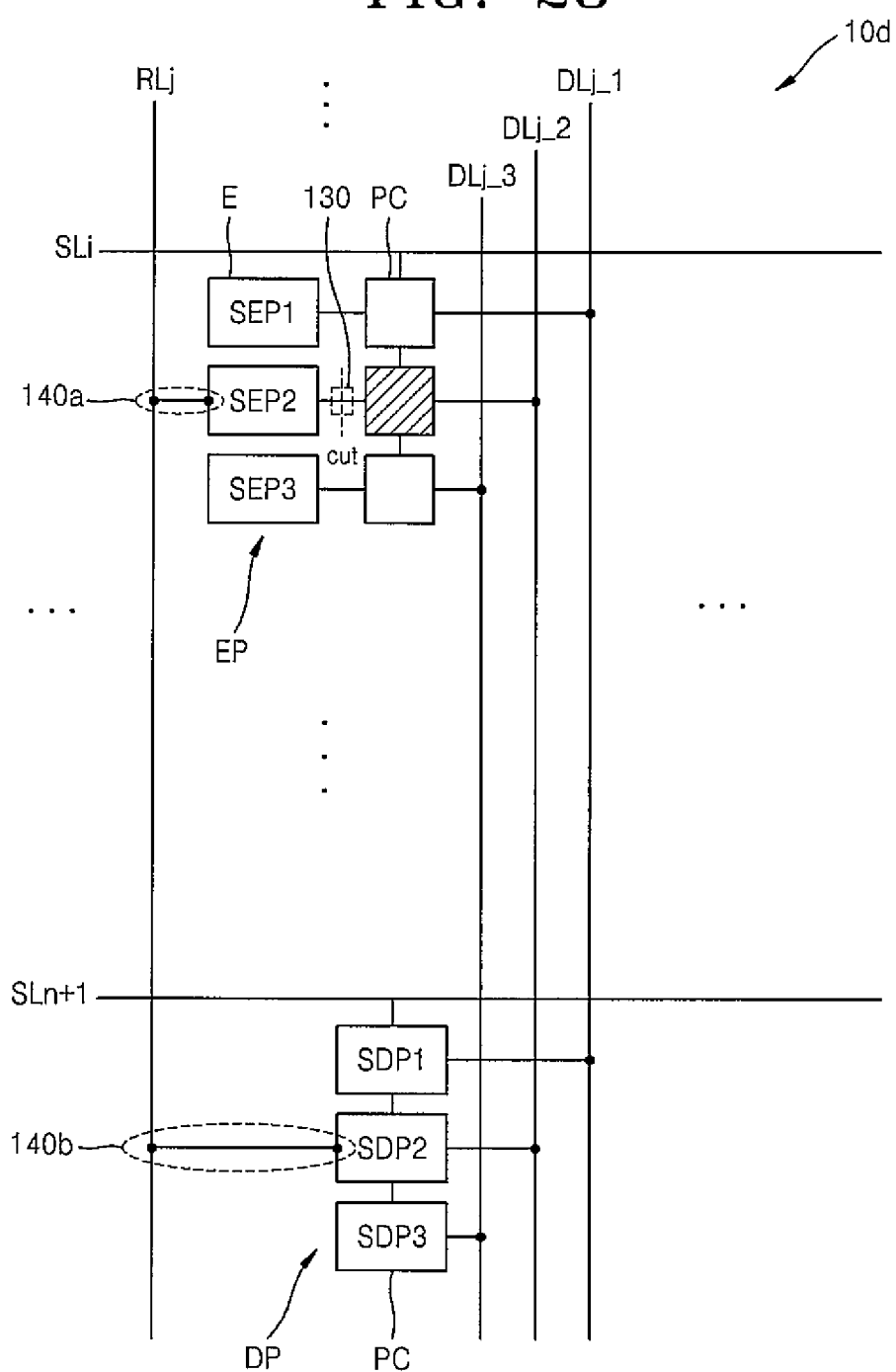
FIG. 28 is a schematic diagram of a display panel according to another embodiment of the present invention.

FIG. 28 is a schematic diagram of a display panel 10d according to another embodiment of the present invention.

Referring to FIG. 28, a plurality of pixels P aligned in a substantial matrix shape where a plurality of scan lines SL crossing a plurality of data lines DL and a plurality of repair lines RL are formed at the display panel 10d. The pixels P include emission pixels EP formed on a display area AA, and dummy pixels DP formed on a non-display area NA. The non-display area NA may be formed on at least one of top and bottom regions of the display area AA. As such, one or more dummy pixels DP may be formed in each pixel column on at least one of upper or lower regions of the pixel column. FIG. 28 shows an example that the dummy pixel DP is formed on the lower region of the pixel column.

One emission pixel EP includes first through third sub emission pixels SEP1, SEP2, and SEP3 aligned in a column direction. Each of the first through third sub emission pixels SEP1, SEP2, and SEP3 includes a pixel circuit PC, and an emission device E coupled to the pixel circuit PC. The emission device E may be an OLED including an anode, a cathode, and an emission layer between the anode and the cathode. The pixel circuits PC and/or the emission devices E of the first through third sub emission pixels SEP1, SEP2, and SEP3 may differ in size. The first through third sub emission pixels SEP1, SEP2, and SEP3 are commonly coupled to one scan line, for example, an ith scan line SLi, and are respectively coupled to first through third data lines DLj_1, DLj_2, and DLj_3. Accordingly, if a scan signal is provided to the ith scan line SLi, data signals are provided via the first through third data lines DLj_1, DLj_2, and DLj_3 respectively to the first through third sub emission pixels SEP1, SEP2, and SEP3, and thus each of the first through third sub emission pixels SEP1, SEP2, and SEP3 charges a voltage corresponding to the provided data signal, and emits light of a brightness corresponding to the charged voltage.

One dummy pixel DP includes first through third sub dummy pixels SDP1, SDP2, and SDP3 aligned in a column direction. Each of the first through third sub dummy pixels SDP1, SDP2, and SDP3 includes only a pixel circuit PC and does not include an emission device E. The pixel circuit PC of each of the first through third sub dummy pixels SDP1, SDP2, and SDP3 is otherwise the same as the pixel circuit PC of each of the first through third sub emission pixels SEP1, SEP2, and SEP3. The first through third sub dummy pixels SDP1, SDP2, and SDP3 are commonly coupled to one scan line, for example, an (n+1)th scan line SLn+1, and are respectively coupled to the first through third data lines DLj_1, DLj_2, and DLj_3. Accordingly, if a scan signal is provided to the (n+1)th scan line SLn+1, data signals are provided via the first through third data lines DLj_1, DLj_2, and DLj_3 respectively to the first through third sub dummy pixels SDP1, SDP2, and SDP3.

From among the first through third sub emission pixels SEP1, SEP2, and SEP3, if the pixel circuit PC of the second sub emission pixel SEP2 is defective, a cutting unit 130 for coupling the pixel circuit PC of the second sub emission pixel SEP2 to the emission device E is cut, and the emission device E is coupled to the repair line RLj. Also, from among the first through third sub dummy pixels SDP1, SDP2, and SDP3, the pixel circuit PC of the second sub dummy pixel SDP2 corresponding to the second sub emission pixel SEP2 is coupled to the repair line RLj.

If scan signals are sequentially provided to first through nth scan lines SL1 through SLn in a scan period, data signals are provided via the first through third data lines DLj_1, DLj_2, and DLj_3 respectively to the first through third sub emission pixels SEP1, SEP2, and SEP3. If a last scan signal is provided to the (n+1)th scan line SLn+1, data signals the same as the data signals provided to the first through third sub emission pixels SEP1, SEP2, and SEP3 are provided to the first through third sub dummy pixels SDP1, SDP2, and SDP3, and a current according to a voltage corresponding to the data signal charged in the second sub dummy pixel SDP2 coupled to the repair line RLj is provided via the repair line RLj to the second sub emission pixel SEP2. As such, in an emission period, all emission pixels EP may simultaneously emit light.

FIG. 28 shows an example that a dummy pixel is formed as a plurality of sub-pixels when a plurality of sub-pixels included in one pixel have different characteristics. However, even in the present embodiment, the same driving principal may also be applied by forming a dummy pixel as one sub-pixel and by correcting a gamma value of a data signal provided to the dummy pixel.

In the above-described embodiments, a pixel circuit is formed as a p-channel metal-oxide semiconductor (PMOS) transistor, and a low-level signal is an enable signal while a high-level signal is a disable signal. However, embodiments of the present invention may also be applied by forming the pixel circuit as an n-channel metal-oxide semiconductor (NMOS) transistor and inverting the provided signals. In this case, a high-level signal is an enable signal and a low-level signal is a disable signal.

According to embodiments of the present invention, an operating point of a TFT is included in a saturation range and, if an anode of a defective pixel has a high resistance, a current of the defective pixel may be corrected by predicting a resistance value.

Embodiments of the present invention are not limited to the above-described pixel structure and simultaneous emission driving, and may be applied to various pixels for simultaneously emitting light by using various methods, and may achieve simultaneous light emission without a bright spot or a dark spot even when a pixel circuit of an emission pixel is defective by separating the pixel circuit from an emission device and coupling a pixel circuit of a dummy pixel via a repair line.

According to embodiments of the present invention, a simultaneous emission driving display device may be normally driven without changing a bright spot into a dark spot by easily repairing a defective pixel by using a dummy pixel.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light-emitting display device comprising:
a plurality of emission pixels aligned in columns and rows, each of the emission pixels comprising an emission device and a first pixel circuit coupled to the emission device;
at least one dummy pixel in each column, each dummy pixel comprising a second pixel circuit; and
a plurality of repair lines, each of the repair lines extending along the emission pixels in each column, wherein each of the repair lines is configured to be electrically coupled to the emission device of one of the emission pixels and to the second pixel circuit of the at least one dummy pixel in each column.

2. The organic light-emitting display device of claim 1, wherein a same data signal is provided to one of the emission pixels and the dummy pixel coupled to a same repair line at a different time, and
wherein the emission pixels are configured to simultaneously emit light.

3. The organic light-emitting display device of claim 1, wherein the emission pixels are at a display area, and wherein the dummy pixel is at a non-display area and at least one of a first row and a last row.

4. The organic light-emitting display device of claim 1, wherein dummy pixels in a same row are connected to a same scan line.

5. The organic light-emitting display device of claim 1, wherein at least one of the repair lines is electrically coupled to the emission device of one of the emission pixels and to the second pixel circuit of one dummy pixel, in a same column.

6. The organic light-emitting display device of claim 5, wherein the emission pixel coupled to one of the repair lines comprises a first conductive unit contacting an anode of the emission device, and first contact metal for coupling the first conductive unit to the repair line, and
wherein the dummy pixel coupled to the one of the repair lines comprises a second conductive unit extending from the second pixel circuit, and second contact metal for coupling the second conductive unit to the repair line.

7. The organic light-emitting display device of claim 6, wherein the first conductive unit and the repair line are at a same layer.

8. The organic light-emitting display device of claim 6, wherein the repair line is at a same layer and comprises a same material as source and drain electrodes of thin film transistors of the first and second pixel circuits.

9. The organic light-emitting display device of claim 6, wherein the repair line is at a same layer and comprises a same material as the anode.

10. The organic light-emitting display device of claim 1, further comprising at least one insulating layer between one of the repair lines and a first conductive unit contacting an anode of the emission device of one of the emission pixels coupled to the one of the repair lines, and between the one of the repair lines and a second conductive unit coupled to the second pixel circuit of one dummy pixel coupled to the repair line,
wherein the first and second conductive units are electrically connected to the one of the repair lines.

11. The organic light-emitting display device of claim 10, wherein the first and second conductive units are at a same layer and comprise a same material as gate electrodes of thin film transistors of the first and second pixel circuits, and
wherein the repair line is at a same layer and comprises a same material as source and drain electrodes of the thin film transistor.

12. A method of driving an organic light-emitting display device, the organic light-emitting display device comprising:
- a plurality of emission pixels columns and rows, the emission pixels each comprising an emission device and a first pixel circuit coupled to the emission device;
- at least one dummy pixel in each column, each dummy pixel comprising a second pixel circuit; and
- a plurality of repair lines, each of the repair lines extending along the emission pixels in each column, wherein at least one of the repair lines is electrically coupled to the emission device of one of the emission pixels and to the second pixel circuit of one dummy pixel, in a same column, the method comprising:
- sequentially providing data signals to the emission pixels and to the dummy pixel in each column, wherein a same data signal is provided to one of the emission pixels coupled to one of the repair lines and to the dummy pixel coupled to the one of the repair lines; and
- simultaneously emitting light from emission devices of the emission pixels according to driving currents corresponding to the data signals.

13. The method of claim 12, wherein the dummy pixel is at least one of a first row or a last row of its corresponding column.

14. The method of claim 12, wherein the sequentially providing data signals is before the simultaneously emitting light from emission devices, in a frame.

15. The method of claim 12, wherein the sequentially providing data signals and the simultaneously emitting light from emission devices partially and temporally overlap.

16. A method of repairing an organic light-emitting display device, the organic light-emitting display device comprising:
- a plurality of emission pixels in columns and rows, each of the emission pixels comprising an emission device and a first pixel circuit coupled to the emission device;
- at least one dummy pixel in each column, each dummy pixel comprising a second pixel circuit; and
- a plurality of repair lines, each of the repair lines extending along the emission pixels in each column, wherein each of the repair lines is configured to be electrically coupled to the emission device of one of the emission pixels and to the second pixel circuit of one dummy pixel in each column, the method comprising:
- decoupling the emission device of a first defective pixel of the emission pixels from the first pixel circuit of the first defective pixel;
- coupling the emission device of the first defective pixel to the repair line in a same column as the first defective pixel; and
- coupling the repair line to the second pixel circuit of a first dummy pixel in the same column as the first defective pixel for enabling the first dummy pixel to receive a data signal that matches the data signal provided to the first defective pixel, for providing a driving current corresponding to the received data signal via the repair line to the emission device of the first defective pixel, and for allowing the first defective pixel to emit light.

17. The method of claim 16, wherein the coupling the emission device of the first defective pixel to the repair line comprises forming first contact metal on a first conductive unit coupled to an anode of the emission device of the first defective pixel, and
- wherein the coupling of the repair line to the second pixel circuit of the first dummy pixel comprises forming second contact metal on a second conductive unit coupled to the second pixel circuit of the first dummy pixel.

18. The method of claim 16, wherein the coupling the emission device of the first defective pixel to the repair line comprises electrically coupling a first conductive unit, which is coupled to an anode of the emission device of the first defective pixel, to the repair line, which is insulated from the first conductive unit by at least one insulating layer, and
- wherein the coupling the repair line to the second pixel circuit of the first dummy pixel comprises electrically coupling a second conductive unit, which is coupled to the second pixel circuit of the first dummy pixel, to the repair line, which insulated from the second conductive unit by at least one insulating layer.

19. The method of claim 16, further comprising:
- decoupling the emission device of a second defective pixel, which is in the same column as the first defective pixel, from the first pixel circuit;
- cutting the repair line between the first and second defective pixels; and
- coupling the second pixel circuit of a second dummy pixel, which is in the same column as the first defective pixel, to a portion of the repair line from which the first defective pixel is electrically isolated due to the cutting of the repair line, so as to be configured to receive a data signal that matches the data signal provided to the second defective pixel, to provide a driving current corresponding to the received data signal via the repair line to the emission device of the second defective pixel, and to allow the second defective pixel to emit light.

* * * * *